United States Patent
Kunoh et al.

(10) Patent No.: US 12,255,278 B2
(45) Date of Patent: Mar. 18, 2025

(54) SEMICONDUCTOR LIGHT EMITTING ELEMENT AND SEMICONDUCTOR LIGHT EMITTING DEVICE

(71) Applicant: Nuvoton Technology Corporation Japan, Kyoto (JP)

(72) Inventors: Yasumitsu Kunoh, Toyama (JP); Masahiro Kume, Toyama (JP); Masanori Hiroki, Shiga (JP); Keimei Masamoto, Niigata (JP); Toshiya Fukuhisa, Osaka (JP); Shigeo Hayashi, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 680 days.

(21) Appl. No.: 17/198,039

(22) Filed: Mar. 10, 2021

(65) Prior Publication Data

US 2021/0217942 A1    Jul. 15, 2021

Related U.S. Application Data

(63) Continuation of application No. PCT/JP2019/035126, filed on Sep. 6, 2019.

(30) Foreign Application Priority Data

Sep. 13, 2018   (JP) ................................. 2018-171212

(51) Int. Cl.
| | |
|---|---|
| *H01L 33/64* | (2010.01) |
| *H01L 23/00* | (2006.01) |
| *H01L 33/62* | (2010.01) |

(52) U.S. Cl.
CPC ............ *H01L 33/647* (2013.01); *H01L 24/14* (2013.01); *H01L 33/62* (2013.01);
(Continued)

(58) Field of Classification Search
CPC ....... H01L 33/647; H01L 24/14; H01L 33/62; H01L 2224/14519; H01L 2924/12041; H01L 2933/0066; H01L 2933/0075
See application file for complete search history.

(56) References Cited

U.S. PATENT DOCUMENTS

| | | | | |
|---|---|---|---|---|
| 7,307,286 B2 * | 12/2007 | Ito | .................. | H01L 23/293 |
| | | | | 257/E33.059 |
| 7,675,755 B2 * | 3/2010 | Imai | ..................... | H05K 1/0206 |
| | | | | 361/760 |

(Continued)

FOREIGN PATENT DOCUMENTS

| | | |
|---|---|---|
| JP | 2001203386 A | 7/2001 |
| JP | 2002-042525 A | 2/2002 |

(Continued)

OTHER PUBLICATIONS

Japanese Office Action dated May 16, 2023 issued in the corresponding Japanese Patent Application No. 2020-545980.

(Continued)

*Primary Examiner* — Fernando L Toledo
*Assistant Examiner* — Jahae Kim
(74) *Attorney, Agent, or Firm* — Rimon P.C.

(57) ABSTRACT

A semiconductor light emitting element includes: a substrate; an n-type layer; a light emitting layer; a p-type layer; a p electrode located above the p-type layer; an n electrode located in a region that is above the n-type layer and in which the light emitting layer and the p-type layer are not located; a p-electrode bump connected to the p electrode; an n-electrode bump connected to the n electrode; and an insulation bump located in at least one of a region between the n-electrode bump and the p-type layer and a region whose distance from an end of the p-type layer closer to the n-electrode bump is shorter than a distance from the end to the p-electrode bump, in a plan view of the substrate. A (Continued)

surface of the insulation bump opposite to a surface facing the substrate is insulated from the p electrode and the n electrode.

5 Claims, 27 Drawing Sheets

(52) U.S. Cl.
CPC ............. *H01L 2224/14519* (2013.01); *H01L 2924/12041* (2013.01); *H01L 2933/0066* (2013.01); *H01L 2933/0075* (2013.01)

(56) References Cited

U.S. PATENT DOCUMENTS

| | | | |
|---|---|---|---|
| 9,105,829 B2* | 8/2015 | Tischler | H01L 33/642 |
| 10,177,277 B2* | 1/2019 | Chu | H01L 33/0095 |
| 11,183,615 B2* | 11/2021 | Hiroki | H01L 33/486 |
| 2001/0032985 A1 | 10/2001 | Bhat et al. | |
| 2004/0012958 A1 | 1/2004 | Hashimoto et al. | |
| 2005/0082691 A1* | 4/2005 | Ito | C08K 3/36 |
| | | | 257/788 |
| 2005/0194605 A1 | 9/2005 | Shelton et al. | |
| 2008/0101071 A1* | 5/2008 | Imai | H01L 33/64 |
| | | | 257/E25.02 |
| 2010/0252855 A1 | 10/2010 | Kamei | |
| 2013/0248916 A1 | 9/2013 | Suehiro et al. | |
| 2014/0264427 A1 | 9/2014 | Tischler | |

FOREIGN PATENT DOCUMENTS

| | | | |
|---|---|---|---|
| JP | 2003110148 A | | 4/2003 |
| JP | 2007527123 A | | 9/2007 |
| JP | 2008135694 A | | 6/2008 |
| JP | 2013179373 A | | 9/2013 |
| JP | 2013225646 A | | 10/2013 |
| WO | 02/089221 A1 | | 11/2002 |
| WO | 2005091848 A2 | | 10/2005 |
| WO | 2009063638 A | | 5/2009 |

OTHER PUBLICATIONS

International Search Report (ISR) issued on Dec. 10, 2019 in International (PCT) Application No. PCT/JP2019/035126, with English translation.

* cited by examiner

SEMICONDUCTOR LIGHT EMITTING ELEMENT AND SEMICONDUCTOR LIGHT EMITTING DEVICE

CROSS REFERENCE TO RELATED APPLICATIONS

This is a continuation application of PCT International Application No. PCT/JP2019/035126 filed on Sep. 6, 2019, designating the United States of America, which is based on and claims priority of Japanese Patent Application No. 2018-171212 filed on Sep. 13, 2018. The entire disclosures of the above-identified applications, including the specifications, drawings and claims are incorporated herein by reference in their entirety.

FIELD

The present disclosure relates to a semiconductor light emitting element and a semiconductor light emitting device.

BACKGROUND

In recent years, semiconductor light emitting elements such as light emitting diodes are used in light sources such as headlamps of automobiles and outdoor and indoor lightings. As a semiconductor light emitting element, an element having a structure in which a semiconductor layer, a p-side electrode, and an n-side electrode are arranged on one main surface of a translucent substrate is known (for example, see PTL 1). Such a semiconductor light emitting element is required to have improved light output and improved heat dissipation performance. For example, the semiconductor light emitting element described in PTL 1 is flip-chip mounted on a mounting substrate via conductive bumps made of gold or the like, to enhance heat dissipation to the mounting substrate. In the semiconductor light emitting element described in PTL 1, the density of the bumps is increased to enhance heat dissipation to the mounting substrate via the conductive bumps.

CITATION LIST

Patent Literature

PTL 1: International Patent Application Publication No. 2009/063638

SUMMARY

Technical Problem

In the conventional semiconductor light emitting element described in PTL 1, however, a bump cannot be located in a region in which current concentrates between the p-side electrode and the n-side electrode. Thus, in the conventional semiconductor light emitting element, heat dissipation in a region in which current concentrates and the amount of heat generated is largest is insufficient.

The present disclosure has an object of providing a semiconductor light emitting element, etc. that can improve heat dissipation performance.

Solution to Problem

A semiconductor light emitting element according to an aspect of the present disclosure includes: a substrate; an n-type layer located above the substrate and including an n-type semiconductor; a light emitting layer located above the n-type layer; a p-type layer located above the light emitting layer and including a p-type semiconductor; a p electrode located above the p-type layer; an n electrode located in a region that is above the n-type layer and in which the light emitting layer and the p-type layer are not located; a conductive p-electrode bump located above the p electrode and electrically connected to the p electrode; a conductive n-electrode bump located above the n electrode and electrically connected to the n electrode; and an insulation bump located in at least one region selected from a region between the n-electrode bump and the p-type layer and a region whose distance from an end of the p-type layer closer to the n-electrode bump is shorter than a distance from the end of the p-type layer to a position at which the p-electrode bump is located, in a plan view of the substrate, wherein the insulation bump includes a film made of a resin containing a filler and a columnar conductor made of Au, in order from a side on which the substrate is located, a surface of the insulation bump opposite to a surface facing the substrate is insulated from the p electrode and the n electrode, and the insulation bump is located above an end of the p-type layer facing the n electrode.

A semiconductor light emitting element according to another aspect of the present disclosure includes: a substrate; an n-type layer located above the substrate and including an n-type semiconductor; a light emitting layer located above the n-type layer; a p-type layer located above the light emitting layer and including a p-type semiconductor; a p electrode located above the p-type layer; an n electrode located in a region that is above the n-type layer and in which the light emitting layer and the p-type layer are not located; a conductive p-electrode bump located above the p electrode and electrically connected to the p electrode; a conductive n-electrode bump located above the n electrode and electrically connected to the n electrode; and an insulation bump located in at least one region selected from a region between the n-electrode bump and the p-type layer and a region whose distance from an end of the p-type layer closer to the n-electrode bump is shorter than a distance from the end of the p-type layer to a position at which the p-electrode bump is located, in a plan view of the substrate, wherein the insulation bump includes a film made of a resin containing a filler and a columnar conductor made of Au, in order from a side on which the substrate is located, a surface of the insulation bump opposite to a surface facing the substrate is insulated from the p electrode and the n electrode, and the insulation bump is located in a region of the p electrode that has a convex edge shape and is within 50 μm from an end of the p electrode facing the n electrode, in a plan view of the substrate.

A semiconductor light emitting device according to an aspect of the present disclosure includes: the semiconductor light emitting element described above; and a mounting substrate including a first wiring electrode electrically connected to the p-electrode bump and a second wiring electrode electrically connected to the n-electrode bump.

Advantageous Effects

According to the present disclosure, a semiconductor light emitting element, etc. that can improve heat dissipation performance can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge Forming Basis of the Present Disclosure)

Figure 1A:
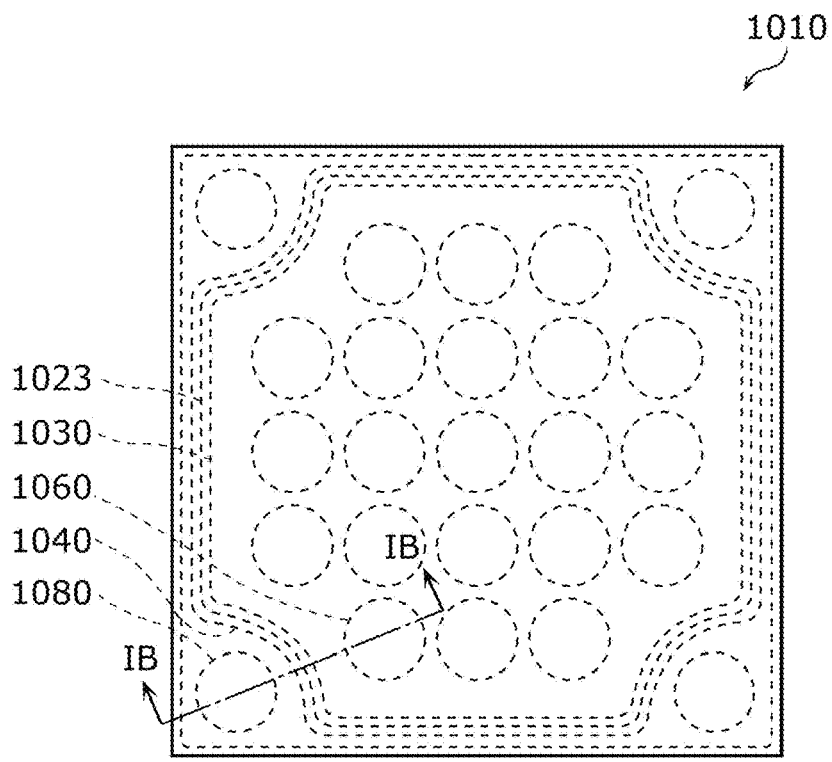
FIG. 1A is a schematic plan view illustrating a structure of a semiconductor light emitting device according to a comparative example.
Figure 1B:
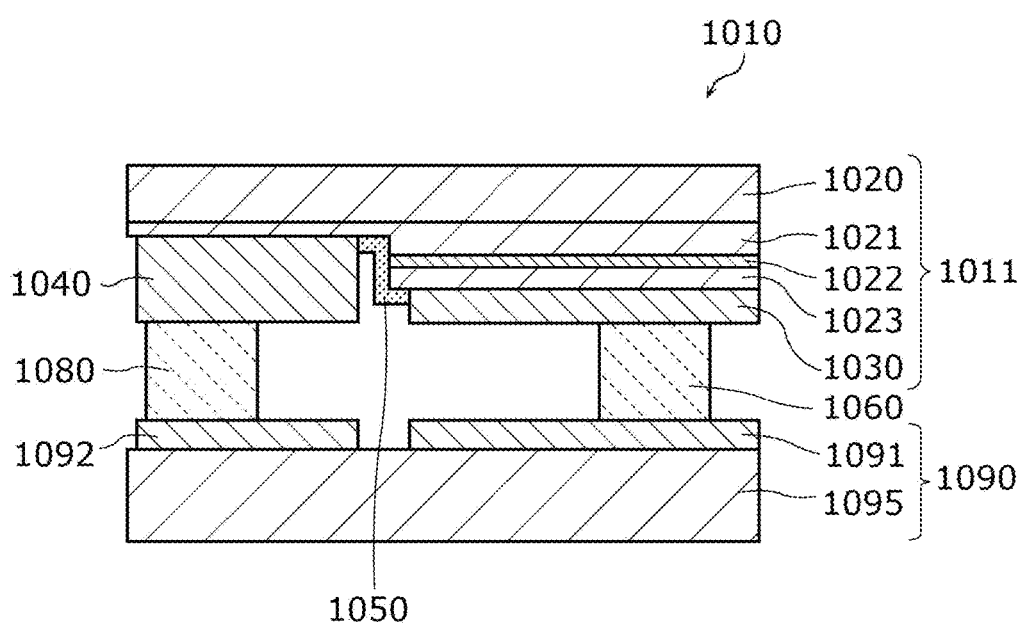
FIG. 1B is a schematic sectional view illustrating the structure of the semiconductor light emitting device according to the comparative example.

Underlying knowledge forming the basis of the present disclosure will be described below, with reference to FIG. 1A to FIG. 2B. FIG. 1A and FIG. 1B are respectively a schematic plan view and sectional view illustrating a structure of semiconductor light emitting device 1010 according to a comparative example. FIG. 1B illustrates a section along line IB-IB in FIG. 1A.

As illustrated in FIG. 1B, semiconductor light emitting device 1010 according to the comparative example includes semiconductor light emitting element 1011 and mounting substrate 1090.

Semiconductor light emitting element 1011 includes substrate 1020, n-type layer 1021, light emitting layer 1022, p-type layer 1023, p electrode 1030, n electrode 1040, insulation film 1050, p-electrode bump 1060, and n-electrode bump 1080.

Substrate 1020 is a base on which the semiconductor layers of semiconductor light emitting element 1011 are stacked. N-type layer 1021 is a semiconductor layer placed on substrate 1020 and including an n-type semiconductor. Light emitting layer 1022 is a semiconductor layer placed on n-type layer 1021. P-type layer 1023 is a semiconductor layer placed on light emitting layer 1022 and including a p-type semiconductor.

Mounting substrate 1090 is a substrate on which semiconductor light emitting element 1011 is mounted. Mounting substrate 1090 includes insulation substrate 1095, first wiring electrode 1091, and second wiring electrode 1092.

In this comparative example, p-electrode bump 1060 in light emitting element 1011 is connected to first wiring electrode 1091 in mounting substrate 1090, and n-electrode bump 1080 in light emitting element 1011 is connected to second wiring electrode 1092 in mounting substrate 1090, as illustrated in FIG. 1B. Thus, in semiconductor light emitting device 1010 according to the comparative example, semiconductor light emitting element 1011 is flip-chip bonded to mounting substrate 1090.

Figure 2A:
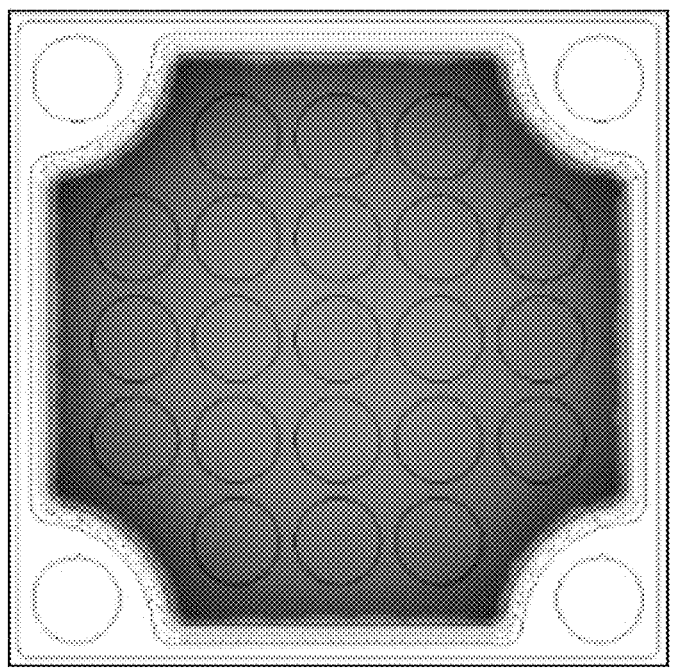
FIG. 2A is a plan view illustrating a result of simulating current density distribution during operation of the semiconductor light emitting device according to the comparative example.
Figure 2A:
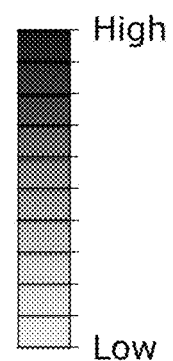
Figure 2B:
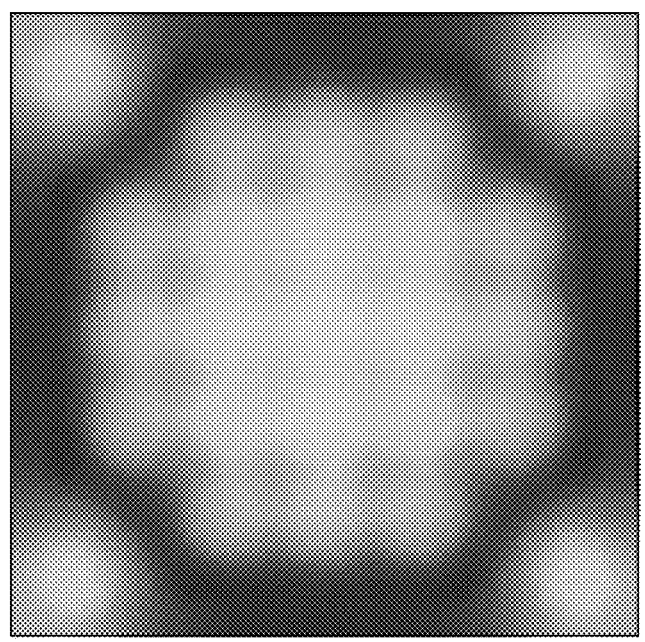
FIG. 2B is a plan view illustrating a result of simulating temperature distribution in a light emitting layer and the light emitting layer side of an n-type layer during operation of the semiconductor light emitting device according to the comparative example.
Figure 2B:
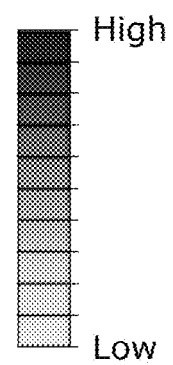

The current density distribution in semiconductor light emitting device 1010 illustrated in FIG. 1A and FIG. 1B and the temperature distribution in light emitting layer 1022 and the light emitting layer 1022 side of n-type layer 1021 will be described below, with reference to FIG. 2A and FIG. 2B. FIG. 2A is a plan view illustrating a result of simulating the current density distribution of current flowing through light emitting layer 1022 in the stacking direction during operation of semiconductor light emitting device 1010 according to the comparative example. FIG. 2B is a plan view illustrating a result of simulating the temperature distribution in light emitting layer 1022 and the light emitting layer 1022 side of n-type layer 1021 during operation of semiconductor light emitting device 1010 according to the comparative example. In FIG. 2A, a region with higher current density is in darker gray. In FIG. 2B, a region with higher temperature is in darker gray.

As illustrated in FIG. 2A, current concentrates in a region of p-type layer 1023 in semiconductor light emitting device 1010 facing n electrode 1040. Heat generated by this current is partly dissipated to mounting substrate 1090 through p-electrode bump 1060 and n-electrode bump 1080. Remaining heat that cannot be dissipated, however, causes the temperature of the light emitting layer in the semiconductor light emitting element in the region to be higher than the temperature of the bump regions, as illustrated in FIG. 2B. Due to such local increase in temperature, the luminous efficiency and reliability of semiconductor light emitting element 1011 degrade. For example, there is a method of reducing the temperature increase in the region by placing a p-electrode bump in the region and releasing heat generated in semiconductor light emitting element 1011 to mounting substrate 1090. However, since the region is near n electrode 1040, if the p-electrode bump is placed in the region, the p-electrode bump may come into contact with the second wiring electrode as a result of a misalignment when mounting semiconductor light emitting element 1011 on mounting substrate 1090. This problem of misalignment is practically inevitable.

When mounting semiconductor light emitting element 1011 on mounting substrate 1090, for example, a misalignment of about 50 μm or more and 100 μm or less can occur. To allow for such a misalignment, it is impossible to employ design in which a p-electrode bump is located in a region within a predetermined distance from the end of p electrode 1030 facing n electrode 1040. Thus, in semiconductor light emitting device 1010 according to the comparative example, the above-described temperature increase in the region of p-type layer 1023 facing n electrode 1040 cannot be reduced.

In view of this, the present disclosure provides a semiconductor light emitting element and a semiconductor light emitting device that can improve heat dissipation performance.

A semiconductor light emitting element according to an aspect of the present disclosure includes: a substrate; an n-type layer located above the substrate and including an n-type semiconductor; a light emitting layer located above the n-type layer; a p-type layer located above the light emitting layer and including a p-type semiconductor; a p electrode located above the p-type layer; an n electrode located in a region that is above the n-type layer and in which the light emitting layer and the p-type layer are not located; a conductive p-electrode bump located above the p electrode and electrically connected to the p electrode; a conductive n-electrode bump located above the n electrode and electrically connected to the n electrode; and an insulation bump located in at least one region selected from a region between the n-electrode bump and the p-type layer and a region whose distance from an end of the p-type layer closer to the n-electrode bump is shorter than a distance from the end of the p-type layer to a position at which the p-electrode bump is located, in a plan view of the substrate, wherein a surface of the insulation bump opposite to a surface facing the substrate is insulated from the p electrode and the n electrode.

In the semiconductor light emitting element according to an aspect of the present disclosure, the insulation bump may be located above an end of the p-type layer facing the n electrode.

In the semiconductor light emitting element according to an aspect of the present disclosure, the insulation bump may be located in a region of the p electrode that has a convex edge shape and in which the p-electrode bump is not located, in a plan view of the substrate.

A semiconductor light emitting device according to an aspect of the present disclosure includes: the semiconductor light emitting element described above; and a mounting substrate including a first wiring electrode electrically connected to the p-electrode bump and a second wiring electrode electrically connected to the n-electrode bump.

In the semiconductor light emitting device according to an aspect of the present disclosure, the insulation bump may be located across an end of the p electrode facing the n electrode in a plan view of the substrate, or satisfy the following inequality:

$$Lp \le a(t_n)/\text{Jave} + b(t_n) \cdot Tc + c(t_n)$$
$$a(t_n) = -3.60 \times 10^{-5} \cdot t_n^2 + 1.69 \times 10^{-2} \cdot t_n + 3.16 \times 10^{-1}$$
$$b(t_n) = 2.26 \times 10^{-5} \cdot t_n^2 - 9.43 \times 10^{-3} \cdot t_n - 1.13$$
$$c(t_n) = -6.37 \times 10^{-4} \cdot t_n^2 - 3.23 \times 10^{-1} \cdot t_n - 3.06$$

where Jave is an average density of current (mA/μm²) injected into the p electrode, Tc is a temperature (° C.) of the mounting substrate, $t_n$ is a thickness (μm) of a part of the n-type layer above which the p electrode is located, and Lp is a distance from an end of the insulation bump closer to the n electrode to an end of the p electrode facing the n-electrode bump.

In the semiconductor light emitting device according to an aspect of the present disclosure, the insulation bump may be located in a region sandwiched between the n electrode and the first wiring electrode, or in a region sandwiched between the p electrode and the second wiring electrode.

In the semiconductor light emitting device according to an aspect of the present disclosure, the mounting substrate may further include a third wiring electrode located between the first wiring electrode and the second wiring electrode and electrically independent of the first wiring electrode and the second wiring electrode.

In the semiconductor light emitting device according to an aspect of the present disclosure, the insulation bump may have a width narrower than a width of a gap between the first wiring electrode and the second wiring electrode, in a section that passes the insulation bump and the n-electrode bump and is perpendicular to a main surface of the substrate.

A semiconductor light emitting element according to an aspect of the present disclosure includes: a substrate; an n-type layer located above the substrate and including an n-type semiconductor; a light emitting layer located above the n-type layer; a p-type layer located above the light emitting layer and including a p-type semiconductor; a p electrode located above the p-type layer; an n electrode located in a region that is above the n-type layer and in which the light emitting layer and the p-type layer are not located; and an insulation layer located between the p electrode and the n electrode and above the p-type layer and the n-type layer, and having a surface parallel to a main surface of the substrate, wherein the surface of the insulation layer extends from a point above the p electrode to a point above the n electrode.

Embodiments of the present disclosure will be described below, with reference to the drawings. The embodiments described below each show a specific example of the present disclosure. The numerical values, shapes, materials, structural elements, the arrangement and connection of the structural elements, steps, the processing order of the steps etc. shown in the following embodiments are mere examples, and do not limit the scope of the present disclosure. Of the structural elements in the embodiments described below, the structural elements not recited in any one of the independent claims representing the broadest concepts of the present disclosure are described as optional structural elements.

Each drawing is a schematic and does not necessarily provide precise depiction. For example, scale and the like are not necessarily consistent throughout the drawings. The substantially same structural elements are given the same reference marks throughout the drawings, and repeated description is omitted or simplified.

The terms "above" and "below" as used herein do not refer to the upward direction (vertically upward) and the downward direction (vertically downward) in absolute space recognition, but are defined depending on the relative positional relationship based on the stacking order in a stack structure. The terms "above" and "below" are used not only in the case where two structural elements are arranged with a spacing therebetween and one or more other structural elements are present between the two structural elements, but also in the case where two structural elements are arranged in contact with each other.

Embodiment 1

A semiconductor light emitting element and a semiconductor light emitting device according to Embodiment 1 will be described below.

[1-1. Basic Structure of Semiconductor Light Emitting Element]

Figure 3:
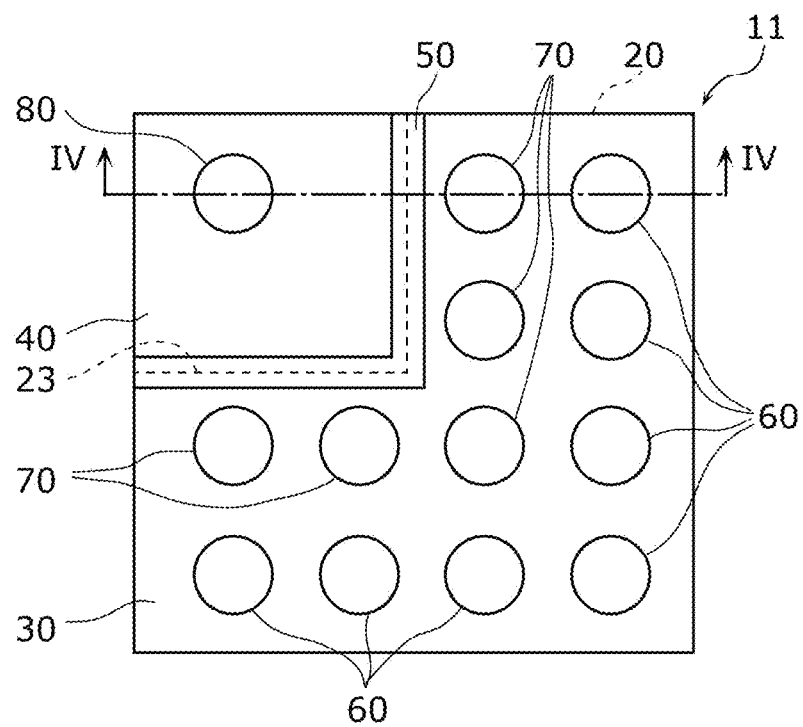
FIG. 3 is a schematic plan view illustrating an example of a structure of a semiconductor light emitting element according to Embodiment 1.
Figure 4:
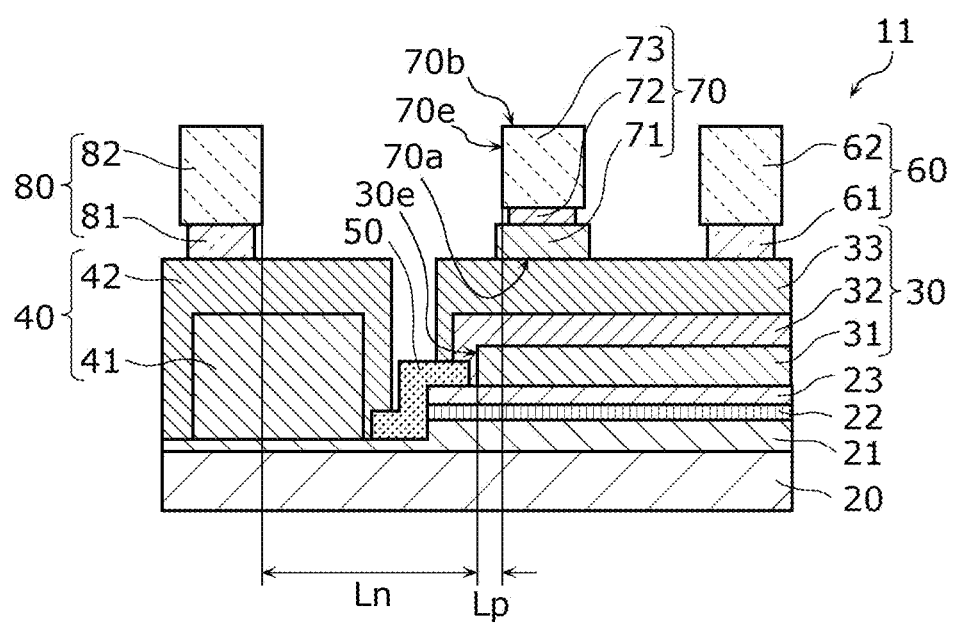
FIG. 4 is a schematic sectional view illustrating an example of the structure of the semiconductor light emitting element according to Embodiment 1.

The basic structure of the semiconductor light emitting element according to this embodiment will be described below, with reference to FIG. 3 and FIG. 4. FIG. 3 and FIG. 4 are respectively a schematic plan view and sectional view illustrating an example of the structure of semiconductor light emitting element 11 according to this embodiment. FIG. 3 is a plan view of substrate 20 in semiconductor light emitting element 11. FIG. 4 is a sectional view of semiconductor light emitting element 11 in FIG. 3 along line IV-IV. Herein, the plan view of substrate 20 in semiconductor light emitting element 11 may be any of a view of semiconductor light emitting element 11 from the side of substrate 20 and a view of semiconductor light emitting element 11 from the side of semiconductor layers stacked on substrate 20. The plan view illustrates the planar positional relationship between the elements constituting semiconductor light emitting element 11 or the elements constituting mounting substrate 90.

As illustrated in FIG. 4, semiconductor light emitting element 11 according to this embodiment includes substrate 20, n-type layer 21, light emitting layer 22, p-type layer 23, p electrode 30, n electrode 40, insulation film 50, p-electrode bump 60, n-electrode bump 80, and insulation bump 70.

Substrate 20 is a base on which the semiconductor layers of semiconductor light emitting element 11 are stacked. Substrate 20 may be a conductive substrate such as an n-type GaN substrate, or an insulation substrate such as sapphire.

N-type layer 21 is a semiconductor layer located above substrate 20 and including an n-type semiconductor. N-type layer 21 is not limited as long as it is a semiconductor layer including an n-type semiconductor. For example, n-type layer 21 is an n-type GaN-based layer.

Light emitting layer 22 is a semiconductor layer located above n-type layer 21. Light emitting layer 22 is located in a region in which n electrode 40 is not located, above n-type layer 21. Light emitting layer 22 is not limited as long as it is a semiconductor layer. For example, light emitting layer 22 is an InGaN-based layer.

P-type layer 23 is a semiconductor layer located above light emitting layer 22 and including a p-type semiconductor. P-type layer 23 is not limited as long as it is a semiconductor layer including a p-type semiconductor. For example, p-type layer 23 is a p-type GaN-based layer.

Insulation film 50 is a protective film that insulates the side surfaces of light emitting layer 22 and p-type layer 23 from n electrode 40 and the like. Insulation film 50 is not limited as long as it is an insulating film. For example, insulation film 50 is a $SiO_2$ film.

P electrode 30 is an electrode located above p-type layer 23. P electrode 30 is not limited as long as it is a conductive film. In this embodiment, p electrode 30 includes reflective ohmic contact layer 31 composed of an Ag film, barrier layer 32 composed of a Ti film, and cover layer 33, in order from the p-type layer 23 side. Cover layer 33 has a Ti film and an Au film stacked in order from the barrier layer 32 side.

N electrode 40 is located in a region that is above n-type layer 21 and in which light emitting layer 22 and p-type layer 23 are not located. N electrode 40 is not limited as long as it is a conductive film. In this embodiment, n electrode 40 includes ohmic contact layer 41 and cover layer 42. Ohmic contact layer 41 has an Al film and a Ti film stacked in order from the n-type layer 21 side. Cover layer 42 has a Ti film and an Au film stacked in order from the ohmic contact layer 41 side.

P-electrode bump 60 is a conductor located above p electrode 30 and electrically connected to p electrode 30. P-electrode bump 60 is not limited as long as it is a conductor. In this embodiment, p-electrode bump 60 includes seed metal 61 and bump 62. Seed metal 61 is a laminate film having a Ti film and an Au film stacked in order from the p electrode 30 side. Bump 62 is a columnar conductor made of Au and located above seed metal 61.

N-electrode bump 80 is a conductor located above n electrode 40 and electrically connected to n electrode 40. N-electrode bump 80 is not limited as long as it is a conductor. In this embodiment, n-electrode bump 80 includes seed metal 81 and bump 82. Seed metal 81 is a laminate film having a Ti film and an Au film stacked in order from the n electrode 40 side. Bump 82 is a columnar conductor made of Au and located above seed metal 81.

Insulation bump 70 is a columnar body located in at least one region selected from a region between n-electrode bump 80 and p-type layer 23 and a region whose distance from the end of p-type layer 23 on the n-electrode bump 80 side is shorter than the distance from the end of p-type layer 23 to the position at which p-electrode bump 60 is located, in a plan view of substrate 20. That is, insulation bump 70 is located in a region between n-electrode bump 80 and p-electrode bump 60 facing n-electrode bump 80, in a plan view of substrate 20 in semiconductor light emitting element 11. Insulation bump 70 is at least partially formed of an insulator, and surface 70b of insulation bump 70 opposite to surface 70a on the substrate 20 side is insulated from p electrode 30 and n electrode 40. In this embodiment, insulation bump 70 includes insulation layer 71, seed metal 72, and bump 73.

Insulation layer 71 is a film made of polyimide containing an $Al_2O_3$ filler and located on p electrode 30. As a result of insulation layer 71 containing an $Al_2O_3$ filler higher in thermal conductivity than polyimide, the thermal conductivity of insulation layer 71 can be enhanced. Seed metal 72 is a laminate film having a Ti film and an Au film stacked in order from the p electrode 30 side. Bump 73 is a columnar conductor made of Au and located above seed metal 72. Thus, in this embodiment, surface 70b of insulation bump 70 opposite to surface 70a on the substrate side is insulated from p electrode 30 by insulation layer 71. Surface 70b is also insulated as a result of being separated from n electrode 40 and n-electrode bump 80 connected to n electrode 40.

As described above, in semiconductor light emitting element 11 according to this embodiment, insulation bump 70 is provided near the end of p-type layer 23 facing n electrode 40. In semiconductor light emitting element 11 according to this embodiment, the amount of heat generated is large in a region near the end of p-type layer 23 facing n electrode 40, as in semiconductor light emitting element 1011 according to the comparative example illustrated in FIG. 1A to FIG. 2B. In semiconductor light emitting element 11 according to this embodiment, insulation bump 70 can be used to release heat generated in the region. Thus, in semiconductor light emitting element 11 according to this embodiment, the heat dissipation property can be improved. In semiconductor light emitting element 11, when the temperature of the light emitting layer increases, the light output decreases due to, for example, a decrease in internal quantum efficiency caused by carrier overflow. In this embodiment, since the heat dissipation property can be improved as mentioned above, a degradation in luminescence property of semiconductor light emitting element 11 can be suppressed. Moreover, as a result of the heat dissipation property being improved, a breakage of semiconductor light emitting element 11 caused by overheating can be prevented, so that a degradation in reliability of semiconductor light emitting element 11 can be suppressed.

In semiconductor light emitting element 11 according to this embodiment, surface 70b of insulation bump 70 is insulated from p electrode 30 and n electrode 40. Accordingly, even in the case where insulation bump 70 comes into contact with another electrode, a short circuit between the other electrode and p electrode 30 and n electrode 40 can be suppressed.

Although p-electrode bump 60, n-electrode bump 80, and insulation bump 70 each have a cylindrical shape in the example illustrated in FIG. 3, the shape of each bump is not limited to a cylindrical shape. For example, the shape may be an elliptic cylinder, a polygonal prism, or the like.

Although insulation bump 70 has a structure in which bump 73 made of a conductor is located above insulation layer 71, the structure of insulation bump 70 is not limited to such. For example, an insulator such as insulation layer 71 may be located above a conductor such as bump 73, or whole insulation bump 70 may be made of an insulator.

[1-2. Structure of Semiconductor Light Emitting Device]

Figure 5A:
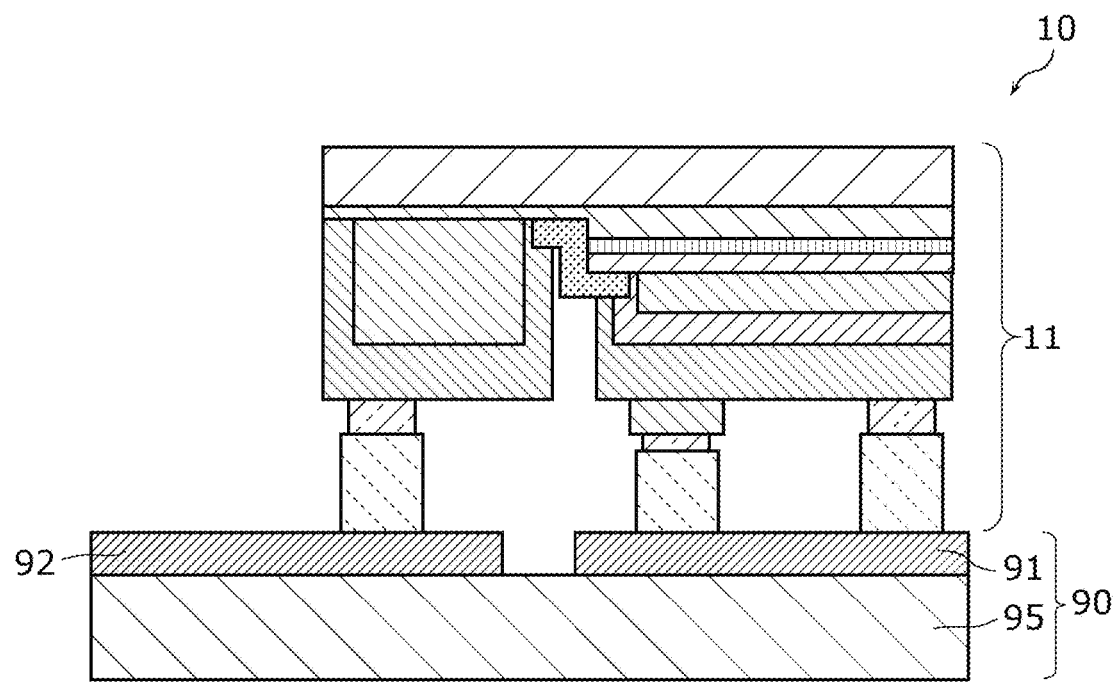
FIG. 5A is a schematic sectional view illustrating a structure of a semiconductor light emitting device according to Embodiment 1.

The structure of semiconductor light emitting device 10 according to this embodiment will be described below, with reference to FIG. 5A. FIG. 5A is a schematic sectional view illustrating the structure of semiconductor light emitting device 10 according to this embodiment. As illustrated in FIG. 5A, semiconductor light emitting device 10 includes semiconductor light emitting element 11 and mounting substrate 90.

Mounting substrate 90 is a substrate on which semiconductor light emitting element 11 is mounted, and includes insulation substrate 95, first wiring electrode 91, and second wiring electrode 92.

Insulation substrate 95 is an insulating substrate serving as a base of mounting substrate 90. Insulation substrate 95 also functions as a heat transfer plate that transfers heat generated in semiconductor light emitting element 11 to a heatsink or the like. Insulation substrate 95 is not limited as long as it is an insulator having high thermal conductivity. For example, insulation substrate 95 is a ceramic substrate made of AlN. It is sufficient that the surface of insulation substrate 95 on which first wiring electrode 91 and second wiring electrode 92 are placed is formed of an insulator, and insulation substrate 95 may be not wholly formed of an insulator. For example, insulation substrate 95 may be a substrate obtained by forming a film of an insulator on one main surface of a conductor substrate.

First wiring electrode 91 is an electrode electrically connected to p-electrode bump 60. For example, first wiring electrode 91 is pattern wiring formed by Au plating.

Second wiring electrode 92 is an electrode electrically connected to n-electrode bump 80. For example, second wiring electrode 92 is pattern wiring formed by Au plating.

As described above, in semiconductor light emitting device 10 according to this embodiment, heat generated near the end of p-type layer 23 facing n electrode 40 can be released to mounting substrate 90 via insulation bump 70. That is, in semiconductor light emitting device 10 according to this embodiment, the heat dissipation property can be improved. A degradation in luminescence property and reliability of semiconductor light emitting device 10 can thus be suppressed.

Figure 5B:
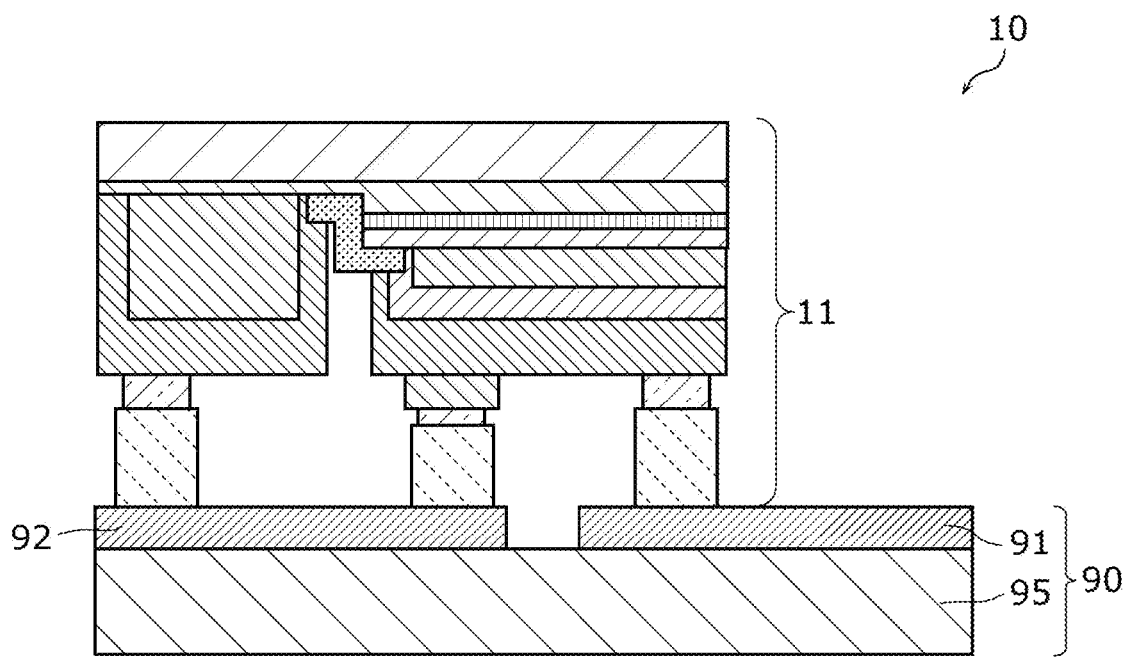
FIG. 5B is a schematic sectional view illustrating a state in the case where a misalignment occurs during mounting in the semiconductor light emitting device according to Embodiment 1.

In semiconductor light emitting element 11 according to this embodiment, surface 70b of insulation bump 70 opposite to surface 70a on the substrate 20 side is insulated from p electrode 30 and n electrode 40. This has the effect of alleviating the problem which can arise when a misalignment occurs during mounting semiconductor light emitting element 11 on mounting substrate 90. The effect will be described below, with reference to FIG. 5B. FIG. 5B is a schematic sectional view illustrating a state in the case where a misalignment occurs during mounting in semiconductor light emitting device 10 according to this embodiment.

As illustrated in FIG. 5B, in the case where a misalignment occurs during mounting, insulation bump 70 may be placed on second wiring electrode 92.

Suppose p-electrode bump 60 is located at the position of insulation bump 70. In such a case, since the p-electrode bump is connected to second wiring electrode 92, second wiring electrode 92 short-circuits with first wiring electrode 91 via the p-electrode bump, p electrode 30, and another p-electrode bump 60. In this state, current does not flow through the semiconductor light emitting element, and therefore the semiconductor light emitting element does not emit light.

In this embodiment, surface 70b of insulation bump 70 is insulated from p electrode 30 and n electrode 40, so that the above-described short circuit does not occur and semiconductor light emitting element 11 emits light. Thus, semiconductor light emitting element 11 and semiconductor light emitting device 10 according to this embodiment can alleviate the problem which can arise in the case where a misalignment occurs during mounting.

[1-3. Placement of Insulation Bump]

The placement of insulation bump 70 according to this embodiment will be described below.

Figure 6:
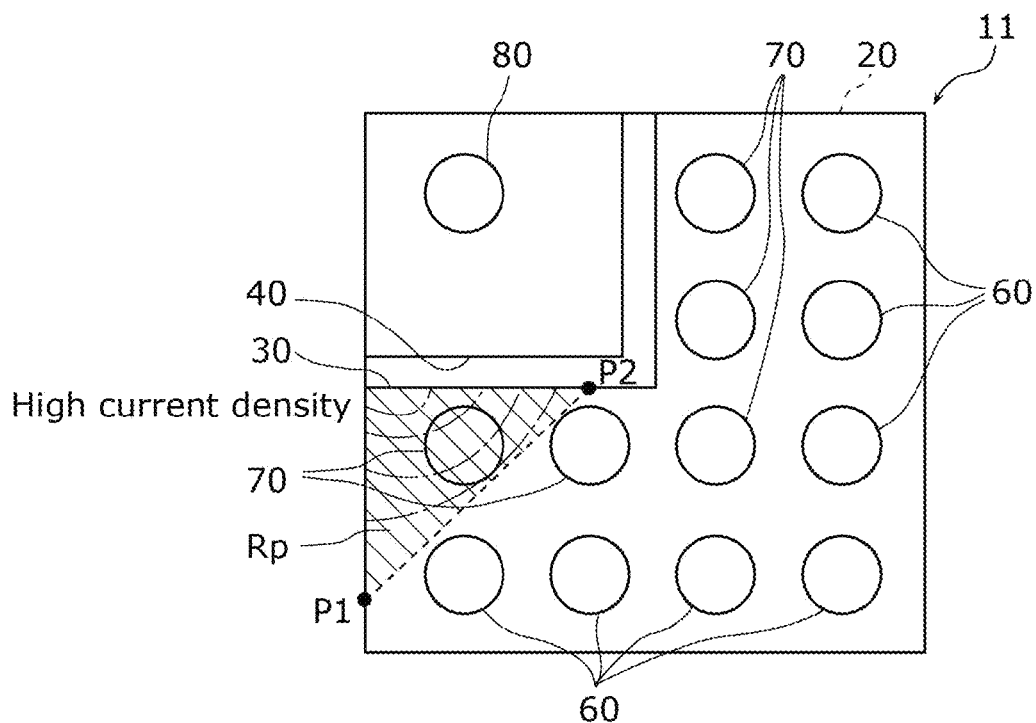
FIG. 6 is a schematic plan view illustrating placement of insulation bumps in a plan view of a substrate of the semiconductor light emitting element according to Embodiment 1.

First, particularly effective placement of insulation bump 70 in the case of placing insulation bump 70 on p electrode 30 will be described below, with reference to FIG. 6. FIG. 6 is a schematic plan view illustrating the placement of insulation bump 70 in a plan view of substrate 20 in semiconductor light emitting element 11 according to this embodiment.

As illustrated in FIG. 6, insulation bump 70 is located in region Rp of p electrode 30 that has a convex edge shape and in which p-electrode bump 60 is not located, in a plan view of substrate 20. Herein, the region of p electrode 30 that has a convex edge shape in a plan view of substrate 20 is a region formed by edges between two points P1 and P2 and a straight line connecting two points P1 and P2. In FIG. 6, an example of region Rp is hatched.

A result of simulating equicurrent density lines in region Rp is indicated by dashed-dotted lines in FIG. 6. As can be understood from FIG. 6, current concentrates in the vicinity of the tip of the convex shape, where the amount of heat generated is large. By placing insulation bump 70 in such region Rp, the heat dissipation property of semiconductor light emitting element 11 can be further improved.

Figure 7A:
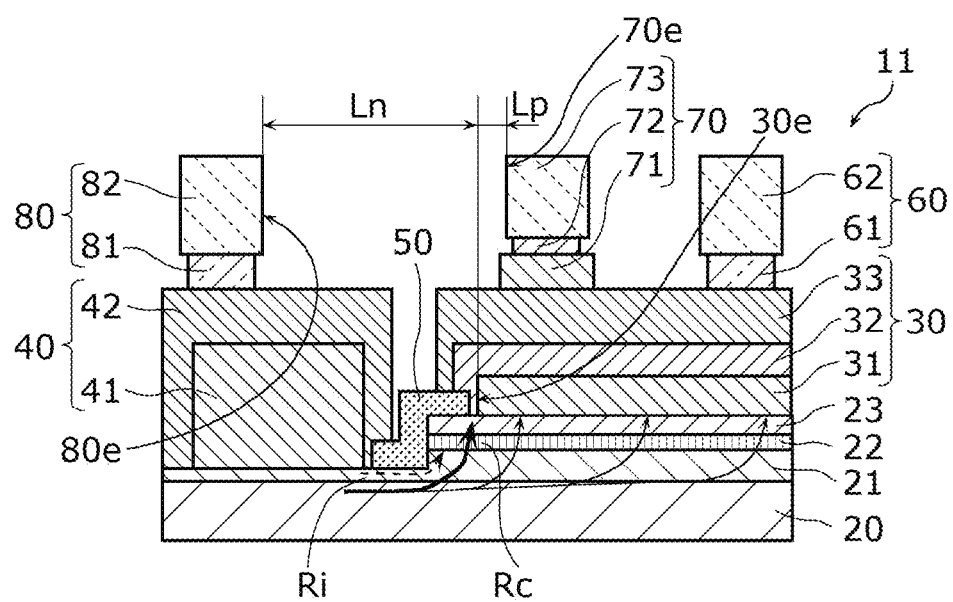
FIG. 7A is a schematic sectional view illustrating a heat generating part in the semiconductor light emitting element according to Embodiment 1.

Next, the distance from the end of p electrode 30 to insulation bump 70 in semiconductor light emitting element 11 according to this embodiment will be described below, with reference to drawings. A heat generating part in semiconductor light emitting element 11 will be described below, with reference to FIG. 7A. FIG. 7A is a schematic sectional view illustrating the heat generating part in semiconductor light emitting element 11 according to this embodiment.

During operation of semiconductor light emitting element 11 according to this embodiment, electrons flow from n electrode 40 to p electrode 30. For example, in the case where conductive substrate 20 is used, current flows in paths through n-type layer 21 and substrate 20 (typically with a large thickness of several ten μm or more), as designated by the solid-line arrows in FIG. 7A illustrating a section of the part where the p electrode and the n electrode face each other. Of these, the path with the shortest distance designated by the thick solid line is lowest in resistance for electrons, and accordingly the flow of current concentrates in the vicinity of the thick solid-line arrow (i.e. near end 30e of the part of contact between reflective ohmic contact layer 31 and p-type layer in the horizontal direction). Hence, the amount of heat generated increases in or around region Rc in light emitting layer 22 directly below p electrode end 30e of the facing part of the p electrode and the n electrode. Consequently, the temperature increase in or around region Rc is largest.

In the case where insulating substrate 20 is used, since current does not flow through substrate 20, current concentrates in thin region Ri of n-type layer 21 between p electrode 30 and n electrode 40, as designated by the dashed-line arrow in FIG. 7A. The thickness of region Ri is typically small, e.g. several µm, so that the resistance value is high. Hence, the amount of heat generated in region Ri is largest, and the temperature increase in region Ri is largest.

In semiconductor light emitting element 11 according to this embodiment, heat generated in the foregoing regions Rc and Ri is mainly dissipated to mounting substrate 90 by insulation bump 70. If the temperature of the light emitting layer exceeds 150° C., for example, a decrease in internal quantum efficiency caused by carrier overflow occurs. Therefore, the placement of insulation bump 70 is determined so that the temperature of the light emitting layer will not exceed 150° C.

Figure 7B:
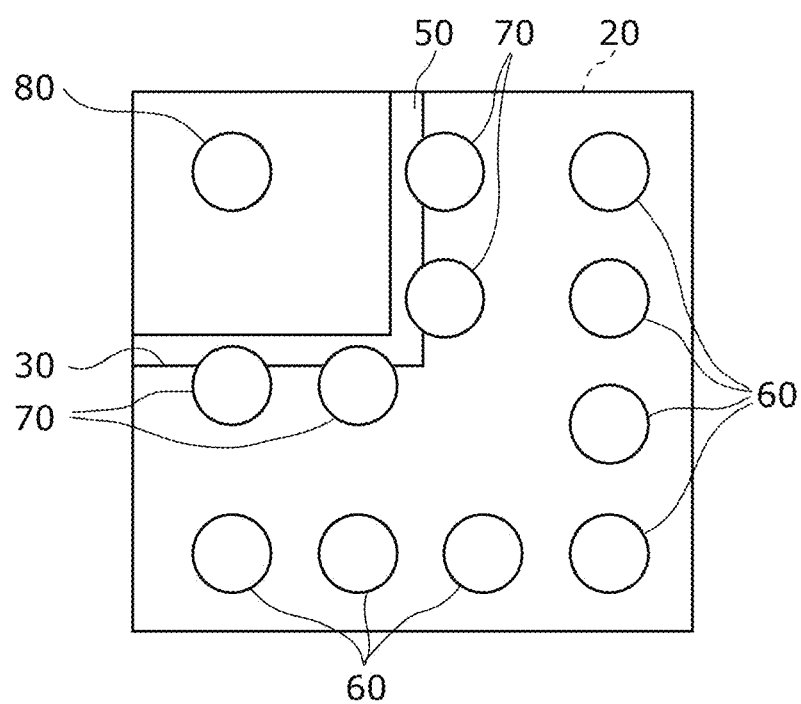
FIG. 7B is a schematic plan view illustrating an example of placement of insulation bumps according to Embodiment 1.

For example, insulation bump 70 may be located across the end of p electrode 30 facing n electrode 40 in a plan view of substrate 20. This placement will be described below, with reference to FIG. 7B. FIG. 7B is a schematic plan view illustrating an example of placement of insulation bump 70 according to this embodiment. FIG. 7B illustrates the example in a plan view of substrate 20.

As illustrated in FIG. 7B, as a result of insulation bump 70 being located across the end of the p electrode facing n electrode 40 in a plan view of substrate 20, heat generated in regions Rc and Ri can be reliably transferred to insulation bump 70.

Figure 8:
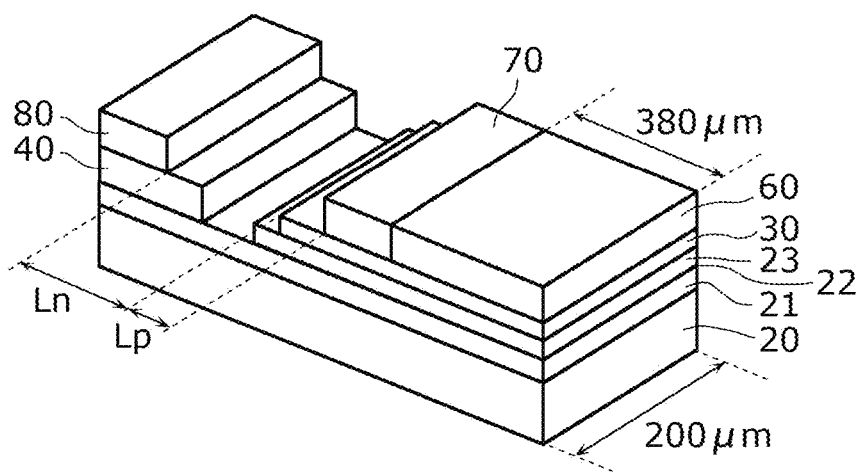
FIG. 8 is a schematic perspective view illustrating a model used in simulation of the semiconductor light emitting element according to Embodiment 1.

As second placement, the distance from the end of bump 73 closer to n electrode 40 to the end of reflective ohmic contact layer 31 facing the n-electrode bump may be set so that the temperature of the light emitting layer will not exceed 150° C. This distance will be described below, with reference to FIG. 4. A method of setting distance Lp from end 70e of bump 73 closer to n electrode 40 to end 30e of the part of reflective ohmic contact layer 31 in contact with the p-type layer on the side facing n-electrode bump 80 so that the temperature of the light emitting layer will not exceed 150° C. will be described below. The temperature of the light emitting layer mainly depends on average current density Jave [mA/µm²] of current injected into p electrode 30, temperature Tc [° C.] of mounting substrate 90 that functions as a heatsink, and thickness $t_n$ [µm] of the part of n-type layer 21 above which p-type layer 23 is located. Accordingly, the allowable range of distance Lp is set using simulation. A model of semiconductor light emitting element 11 used in the simulation will be described below, with reference to FIG. 8. FIG. 8 is a schematic perspective view illustrating the model used in the simulation of semiconductor light emitting element 11 according to this embodiment. As illustrated in FIG. 8, in the model, the width of semiconductor light emitting element 11 is 200 µm. Light emitting layer 22 is an InGaN quantum well layer, and has an emission wavelength of 450 nm. The thickness of the n-type layer is 10 µm to 100 µm, the thickness of the p-type layer is 100 nm, the shape of each of p-electrode bump 60, n-electrode bump 80, and insulation bump 70 is a rectangular parallelepiped, and the length of p-electrode bump 60 is 380 µm. Distance Ln from the end of p electrode 30 facing n-electrode bump 80 to n-electrode bump 80 is 45 µm. The impurity concentration in n-type layer 21 is $5\times10^{18}$ cm$^{-3}$, the resistivity of the p-type layer and the resistivity of the n-type layer are respectively 1 Ωcm and 0.03 Ωcm, and the contact resistance of the p electrode is $5\times10^{-4}$ Ωcm². The temperature of mounting substrate 90 is 27° C., 65° C., or 105° C., and the value of current flowing between p electrode 30 and n electrode 40 is 300 mA, 400 mA, 500 mA, or 600 mA. P-electrode bump 60 and n-electrode bump 80 are made of Au with a thickness of 15 µm, and p electrode 30 and n electrode 40 are made of Au with a thickness of 2 µm. Insulation bump 70 is composed of Au with a thickness of 15 µm and an insulation film (SiO₂) with a thickness of 1 µm. In the actual structure of semiconductor light emitting element 11, p electrode 30 is composed of reflective ohmic contact layer 31, barrier layer 32, and cover layer 33, as illustrated in FIG. 4. The end of p electrode 30 in this case is the end of reflective ohmic contact layer 31 in contact with p-type layer 23. Distances Lp and Ln are illustrated in FIG. 4. The current distribution was analyzed using device simulation software, and the temperature of light emitting layer 22 was determined. The device simulation software used in this simulation is capable of calculating a one-dimensional band structure in a semiconductor layer and a three-dimensional current distribution and temperature distribution.

From the simulation result, distance Lp when the maximum in-plane temperature of light emitting layer 22 is 150° C. was calculated for current density Jave, temperature Tc of the mounting substrate, and thickness $t_n$ of n-type layer 21. Distance Lp can be expressed by the following equation using current density Jave, temperature Tc, and thickness $t_n$.

$$Lp = a(t_n)/Jave + b(t_n)\cdot Tc + c(t_n) \qquad (1)$$

Here, distance Lp when the maximum in-plane temperature of light emitting layer 22 is 150° C. is inversely proportional to current density Jave and is proportional to temperature Tc of mounting substrate 90, and each proportionality coefficient and constant term are approximated by a function of thickness $t_n$. In the case where substrate 20 is conductive, the thickness of substrate 20 is added to thickness $t_n$ of n-type layer 21.

By fitting the function of equation (1) to the simulation result, functions $a(t_n)$, $b(t_n)$, and $c(t_n)$ were accurately fitted with a quadratic function as follows.

$$a(t_n) = -3.60\times 10^{-5}\cdot t_n^2 + 1.69\times 10^{-2}\cdot t_n + 3.16\times 10^{-1}$$

$$b(t_n) = 2.26\times 10^{-5}\cdot t_n^2 - 9.43\times 10^{-3}\cdot t_n - 1.13$$

$$c(t_n) = -6.37\times 10^{-4}\cdot t_n^2 - 3.23\times 10^{-1}\cdot t_n - 3.06$$

Therefore, the temperature of light emitting layer 22 can be prevented from exceeding 150° C., by satisfying the following inequality (2) for distance Lp.

$$Lp \leq a(t_n)/Jave + b(t_n)\cdot Tc + c(t_n) \qquad (2)$$

As described above, insulation bump 70 may be placed so that inequality (2) will hold. This can prevent the temperature of light emitting layer 22 from exceeding 150° C. Consequently, for example, a decrease in internal quantum efficiency caused by carrier overflow can be suppressed, so that a decrease in light output of semiconductor light emitting element 11 can be suppressed.

[1-4. Manufacturing Method]

A manufacturing method for semiconductor light emitting element 11 and semiconductor light emitting device 10 according to this embodiment will be described below. First, the manufacturing method for semiconductor light emitting element 11 will be described below, with reference to FIG. 9A to FIG. 9K. FIG. 9A to FIG. 9K are each a schematic sectional view illustrating a step in the manufacturing method for semiconductor light emitting element 11 according to this embodiment.

Figure 9A:
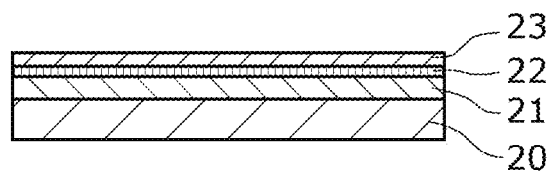
FIG. 9A is a schematic sectional view illustrating a first step in a manufacturing method for the semiconductor light emitting element according to Embodiment 1.

First, n-type layer 21, light emitting layer 22, and p-type layer 23 are stacked above substrate 20 in this order, as illustrated in FIG. 9A. In this embodiment, n-type layer 21 composed of an n-type GaN-based layer, light emitting layer 22 composed of an InGaN-based layer, and p-type layer 23 composed of a p-type GaN-based layer are epitaxially grown on substrate 20 composed of an n-type GaN substrate, using a metal-organic vapor phase epitaxy (MOVPE) method.

Figure 9B:
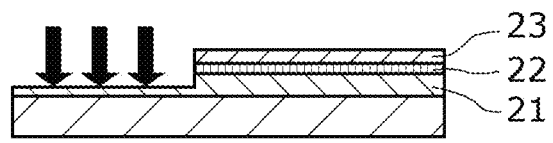
FIG. 9B is a schematic sectional view illustrating a second step in the manufacturing method for the semiconductor light emitting element according to Embodiment 1.

Next, part of each of p-type layer 23, light emitting layer 22, and n-type layer 21 is removed, as illustrated in FIG. 9B. In this embodiment, part of each layer is dug and removed in the arrow direction by dry etching.

Figure 9C:
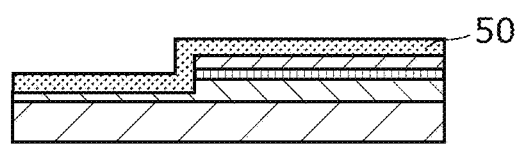
FIG. 9C is a schematic sectional view illustrating a third step in the manufacturing method for the semiconductor light emitting element according to Embodiment 1.

Next, insulation film 50 is formed above these layers, as illustrated in FIG. 9C. In this embodiment, a $SiO_2$ film with a thickness of approximately 0.7 μm is formed above the whole surface of substrate 20.

Figure 9D:
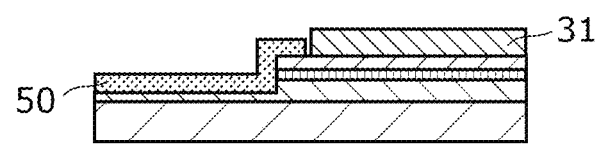
FIG. 9D is a schematic sectional view illustrating a fourth step in the manufacturing method for the semiconductor light emitting element according to Embodiment 1.

Next, most of insulation film 50 on p-type layer 23 is removed, and reflective ohmic contact layer 31 is formed in the region where insulation film 50 has been removed on p-type layer 23, as illustrated in FIG. 9D. In this embodiment, a resist is applied to insulation film 50, an opening is formed in the resist on p-type layer 23 by photolithography, and insulation film 50 in the opening is removed using hydrofluoric acid (HF). In the part where insulation film 50 has been removed, reflective ohmic contact layer 31 composed of an Ag film with a thickness of approximately 0.2 μm is formed by vapor deposition. After the formation of reflective ohmic contact layer 31, the remaining resist and the unnecessary Ag film on the resist are removed by a lift-off method.

Figure 9E:
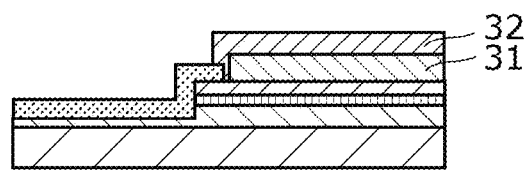
FIG. 9E is a schematic sectional view illustrating a fifth step in the manufacturing method for the semiconductor light emitting element according to Embodiment 1.

Next, barrier layer 32 is formed on reflective ohmic contact layer 31, as illustrated in FIG. 9E. In this embodiment, barrier layer 32 composed of a Ti film with a thickness of approximately 0.7 μm is formed by sputtering, a resist is applied, and the resist and the Ti film other than the part where barrier layer 32 is located are removed using lithography and HF.

Figure 9F:
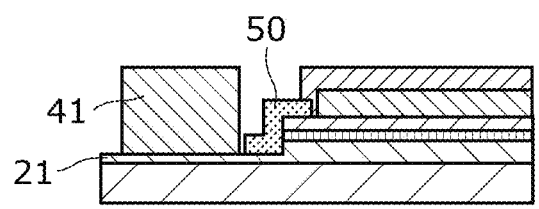
FIG. 9F is a schematic sectional view illustrating a sixth step in the manufacturing method for the semiconductor light emitting element according to Embodiment 1.

Next, ohmic contact layer 41 is formed on n-type layer 21, as illustrated in FIG. 9F. The region of n-type layer 21 where ohmic contact layer 41 is formed is the region from which part of each of p-type layer 23, light emitting layer 22, and n-type layer 21 has been removed in the previous step. In this embodiment, a resist is applied to insulation film 50, an opening is formed in the resist on n-type layer 21 by photolithography, and insulation film 50 in the opening is removed using HF. In the part where insulation film 50 has been removed, ohmic contact layer 41 composed of an Al film with a thickness of approximately 0.1 μm and a Ti film with a thickness of approximately 0.8 μm is formed by vapor deposition. After the formation of ohmic contact layer 41, the remaining resist, the unnecessary Al film on the resist, and the like are removed by a lift-off method.

Figure 9G:
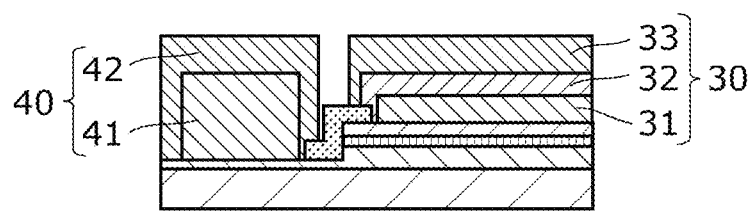
FIG. 9G is a schematic sectional view illustrating a seventh step in the manufacturing method for the semiconductor light emitting element according to Embodiment 1.

Next, cover layer 33 is formed on barrier layer 32, and cover layer 42 is formed on ohmic contact layer 41, as illustrated in FIG. 9G. In this embodiment, a resist is applied to the whole upper surface of substrate 20, and the resist on barrier layer 32 and its surroundings and on ohmic contact layer 41 and its surroundings is removed by photolithography. After this, a Ti film with a thickness of approximately 0.3 μm and an Au film with a thickness of approximately 1 μm are formed on the whole upper surface of substrate 20 in this order by vapor deposition. After this, the resist, the Ti film formed on the resist, and the like are removed by a lift-off method, to form cover layer 33 and cover layer 42.

Figure 9H:
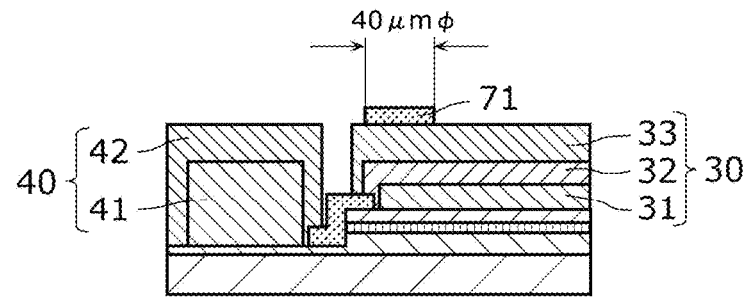
FIG. 9H is a schematic sectional view illustrating an eighth step in the manufacturing method for the semiconductor light emitting element according to Embodiment 1.

Next, insulation layer 71 is formed on p electrode 30, as illustrated in FIG. 9H. In this embodiment, a photosensitive polyimide film is applied onto cover layer 33 of p electrode 30 by spin plating, and patterned by photolithography. The photosensitive polyimide film contains an $Al_2O_3$ filler. The photosensitive polyimide film is then cured by being heated at approximately 150° C. for about 1 hour. Insulation layer 71 with a thickness of approximately 2 μm and a diameter of approximately 40 μm is thus formed.

Figure 9I:
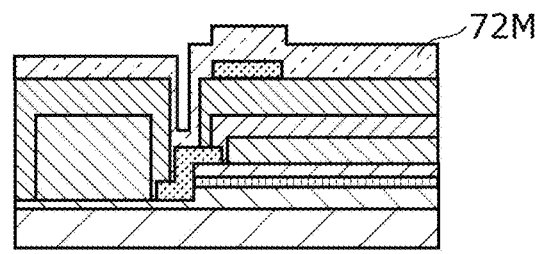
FIG. 9I is a schematic sectional view illustrating a ninth step in the manufacturing method for the semiconductor light emitting element according to Embodiment 1.

Next, seed metal film 72M is formed above the whole surface of substrate 20, as illustrated in FIG. 9I. In this embodiment, seed metal film 72M composed of a Ti film with a thickness of 0.05 μm and an Au film with a thickness of 0.25 μm is formed above the whole surface of substrate 20 by electron beam (EB) vapor deposition.

Figure 9J:
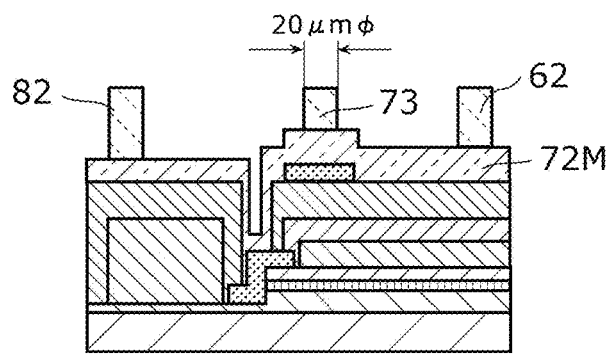
FIG. 9J is a schematic sectional view illustrating a tenth step in the manufacturing method for the semiconductor light emitting element according to Embodiment 1.

Next, bumps 62, 73, and 82 are formed above seed metal film 72M, as illustrated in FIG. 9J. In this embodiment, a resist is applied onto seed metal film 72M, and an opening with a diameter of approximately 20 μm is formed in each bump formation portion by photolithography. An Au plating is then formed in the opening of the resist by DC plating method, and the resist is removed. Bumps 62, 73, and 82 formed of the Au plating with a thickness of approximately 8 μm and a diameter of approximately 20 μm are thus formed.

Figure 9K:
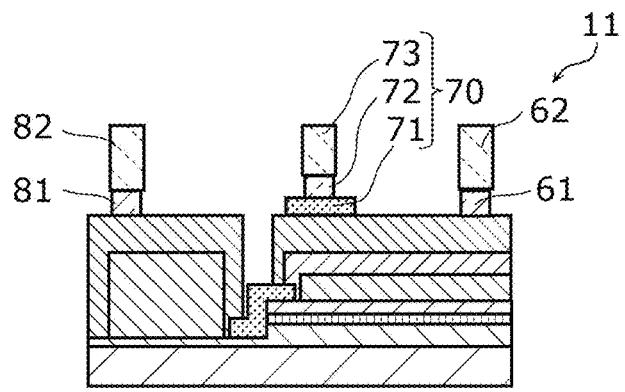
FIG. 9K is a schematic sectional view illustrating an eleventh step in the manufacturing method for the semiconductor light emitting element according to Embodiment 1.

Next, seed metal film 72M is removed partially except the lower part of each bump to form seed metals 61, 72, and 81, as illustrated in FIG. 9K. In this embodiment, the Au layer which is the upper layer of seed metal film 72M is removed using an iodine solution, and the Ti layer which is the lower layer of seed metal film 72M is removed using HF. By removing seed metal film 72M except the lower part of each bump, seed metals 61, 72, and 81 can be formed.

Figure 9L:
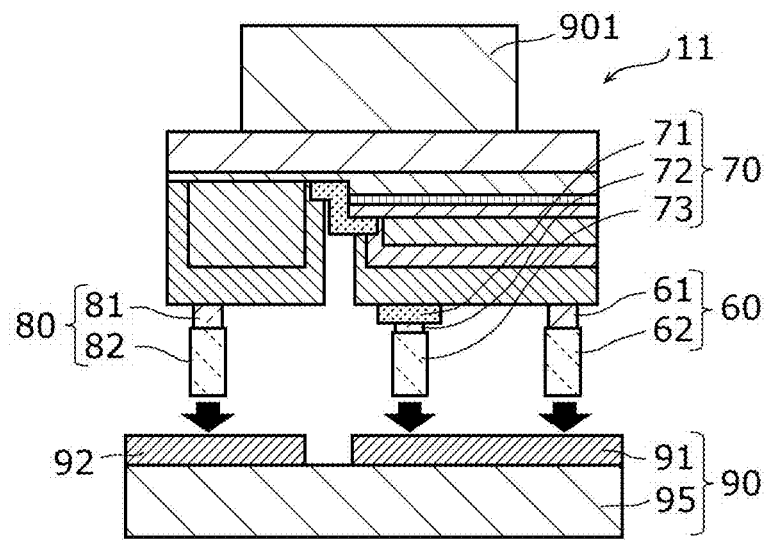
FIG. 9L is a schematic sectional view illustrating a first step in a manufacturing method for the semiconductor light emitting device according to Embodiment 1.
Figure 9M:
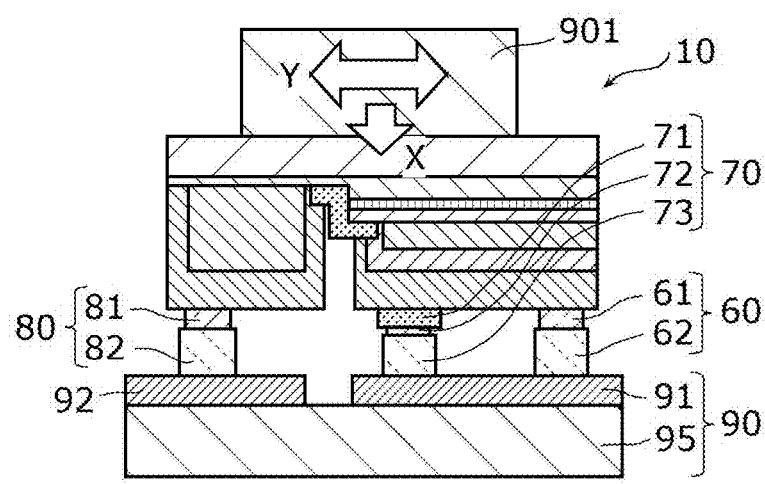
FIG. 9M is a schematic sectional view illustrating a second step in the manufacturing method for the semiconductor light emitting device according to Embodiment 1.

Semiconductor light emitting element 11 according to this embodiment is thus formed. Next, the manufacturing method for semiconductor light emitting device 10 according to this embodiment will be described below, with reference to FIG. 9L and FIG. 9M. FIG. 9L and FIG. 9M are each a schematic sectional view illustrating a step in the manufacturing method for the semiconductor light emitting device according to this embodiment.

First, semiconductor light emitting element 11 and mounting substrate 90 are prepared, and semiconductor light emitting element 11 is held so that p-electrode bump 60 and n-electrode bump 80 will be located respectively above first wiring electrode 91 and second wiring electrode 92 in mounting substrate 90, as illustrated in FIG. 9L. In this embodiment, mounting substrate 90 includes insulation substrate 95 made of AlN, and first wiring electrode 91 and second wiring electrode 92 formed by Au plating. By vacuum-chucking substrate 20 by metal tube 901, semiconductor light emitting element 11 is held in a position in which each bump is situated on the mounting substrate 90 side, above mounting substrate 90. Semiconductor light emitting element 11 is then moved toward mounting substrate 90 to be flip-chip bonded.

Next, each of p-electrode bump 60 and insulation bump 70 and first wiring electrode 91 are bonded by ultrasonic bonding, and n-electrode bump 80 and second wiring electrode 92 are bonded by ultrasonic bonding, as illustrated in FIG. 9M. In this embodiment, heating is performed to approximately 200° C. in a state in which bumps 62 and 73 are in contact with first wiring electrode 91 and bump 82 is in contact with second wiring electrode 92. Further, while pressing semiconductor light emitting element 11 by applying a load of 30 N in a direction (direction of arrow X in FIG. 9M) perpendicular to the main surface of mounting substrate 90, ultrasonic vibration is applied approximately for 200 ms in a direction (direction of arrow Y in FIG. 9M) parallel to the main surface of mounting substrate 90. In this way, bumps 62 and 73 are bonded by ultrasonic bonding to first wiring electrode 91, and bump 82 is bonded by ultrasonic bonding to second wiring electrode 92. The diameter of each of bumps 62 and 73 changes from 20 µm before the bonding to 25 µm after the bonding.

Semiconductor light emitting device 10 according to this embodiment can be manufactured in the above-described way.

Embodiment 2

A semiconductor light emitting device according to Embodiment 2 will be described below. The semiconductor light emitting device according to this embodiment differs from semiconductor light emitting device 10 according to Embodiment 1 in the structure of the wiring electrodes included in the mounting substrate, and is the same as semiconductor light emitting device 10 according to Embodiment 1 on the other points. The semiconductor light emitting device according to this embodiment will be described below, mainly focusing on its differences from semiconductor light emitting device 10 according to Embodiment 1.

[2-1. Structure of Semiconductor Light Emitting Device]

Figure 10:
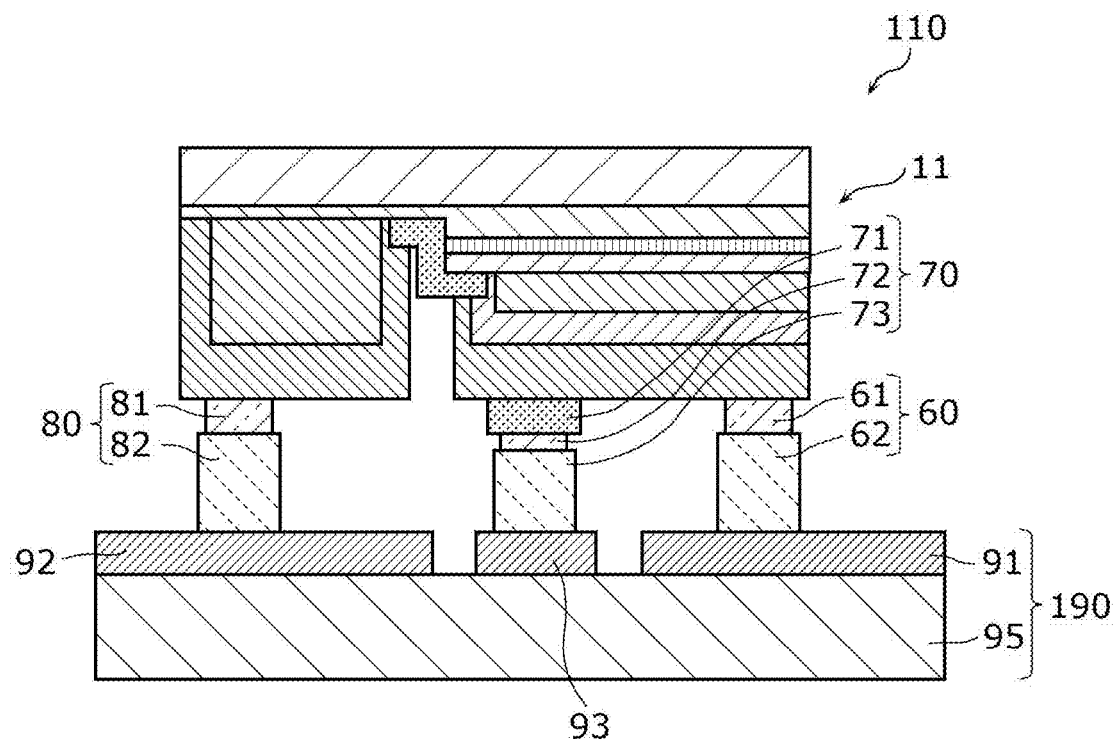
FIG. 10 is a schematic sectional view illustrating a structure of a semiconductor light emitting device according to Embodiment 2.

The structure of the semiconductor light emitting device according to this embodiment will be described below, with reference to FIG. 10. FIG. 10 is a schematic sectional view illustrating the structure of semiconductor light emitting device 110 according to this embodiment. As illustrated in FIG. 10, semiconductor light emitting device 110 according to this embodiment includes semiconductor light emitting element 11 and mounting substrate 190, as with semiconductor light emitting device 10 according to Embodiment 1. Mounting substrate 190 according to this embodiment includes insulation substrate 95, first wiring electrode 91, second wiring electrode 92, and third wiring electrode 93.

Third wiring electrode 93 is an electrode located between first wiring electrode 91 and second wiring electrode 92 and electrically independent of first wiring electrode 91 and second wiring electrode 92. Third wiring electrode 93 is an electrode located on one main surface of insulation substrate 95, as with first wiring electrode 91 and second wiring electrode 92, and insulated from first wiring electrode 91 and second wiring electrode 92. In this embodiment, third wiring electrode 93 is located facing insulation bump 70 in semiconductor light emitting element 11.

Figure 11:
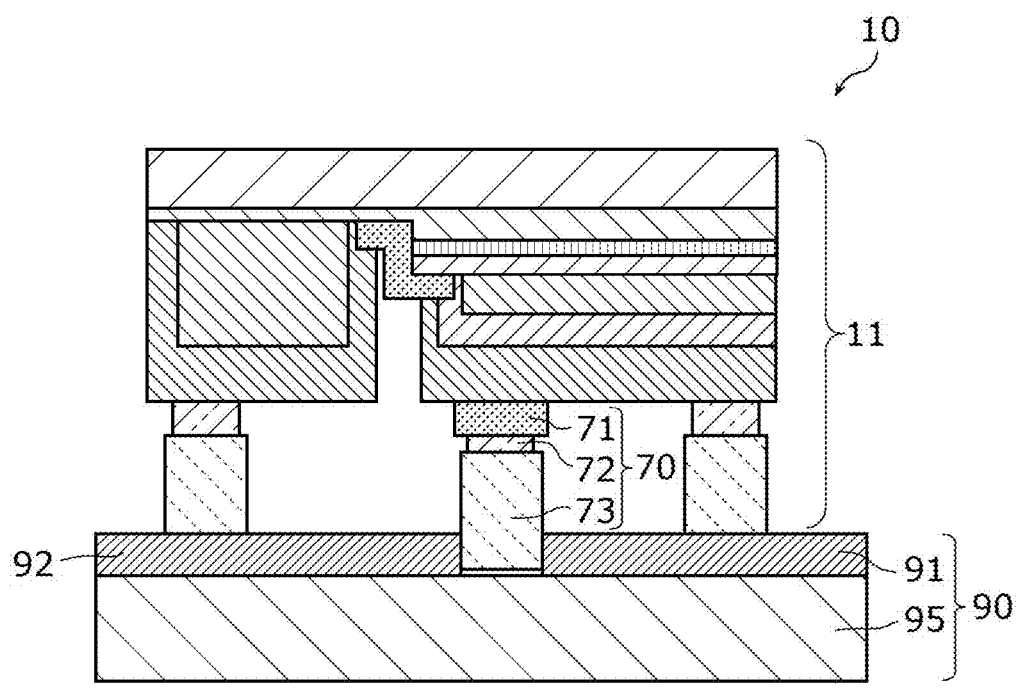
FIG. 11 is a schematic sectional view illustrating a state in the case where a misalignment occurs during mounting in the semiconductor light emitting device according to Embodiment 1.
Figure 12A:
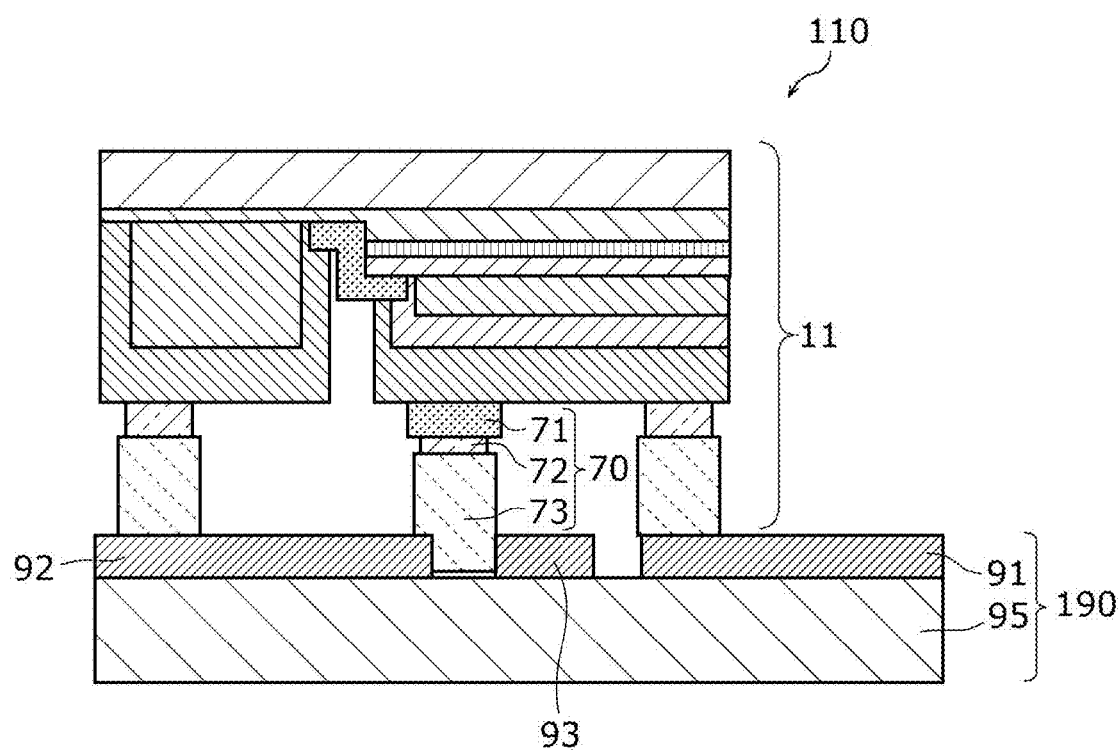
FIG. 12A is a schematic sectional view illustrating an example of a state in the case where a misalignment occurs during mounting in the semiconductor light emitting device according to Embodiment 2.
Figure 12B:
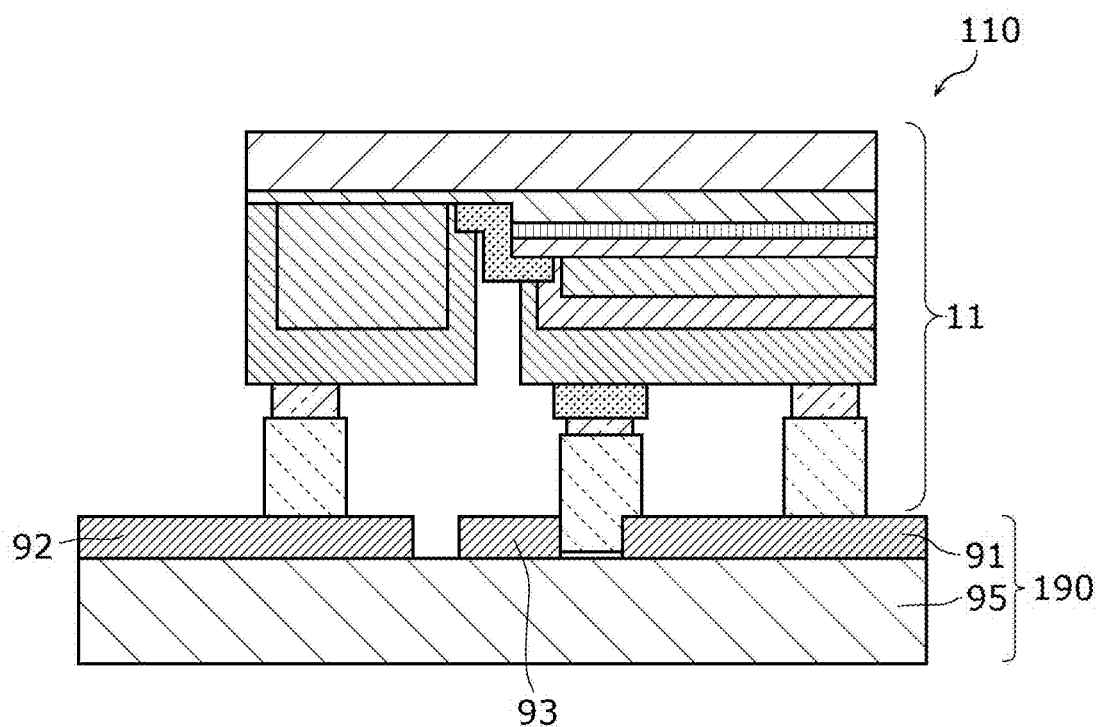
FIG. 12B is a schematic sectional view illustrating another example of a state in the case where a misalignment occurs during mounting in the semiconductor light emitting device according to Embodiment 2.

The effects of semiconductor light emitting device 110 according to this embodiment will be described below in comparison with semiconductor light emitting device 10 according to Embodiment 1, with reference to FIG. 11, FIG. 12A, and FIG. 12B. FIG. 11 is a schematic sectional view illustrating a state in the case where a misalignment occurs during mounting in semiconductor light emitting device 10 according to Embodiment 1. FIG. 12A and FIG. 12B are each a schematic sectional view illustrating an example of a state in the case where a misalignment occurs during mounting in semiconductor light emitting device 110 according to this embodiment.

Consider the case where a misalignment occurs when mounting semiconductor light emitting element 11 on mounting substrate 90 in semiconductor light emitting device 10 according to Embodiment 1, as illustrated in FIG. 11. In this case, if the width of the gap between first wiring electrode 91 and second wiring electrode 92 is less than the width (the dimension in the horizontal direction in FIG. 11, hereafter referred to as "post-bonding width") of bump 73 in insulation bump 70 after semiconductor light emitting element 11 is bonded to mounting substrate 90 and ultrasonic waves are applied, there is a possibility that bump 73 is in contact with both first wiring electrode 91 and second wiring electrode 92. That is, there is a possibility that first wiring electrode 91 and second wiring electrode 92 are short-circuited via bump 73. In such a state, current hardly flows through semiconductor light emitting element 11, and accordingly semiconductor light emitting element 11 does not emit light.

Consider the case where a misalignment occurs when mounting semiconductor light emitting element 11 on mounting substrate 190 in semiconductor light emitting device 110 according to this embodiment. In this case, there is a possibility that second wiring electrode 92 and third wiring electrode 93 are short-circuited via bump 73 as illustrated in FIG. 12A, or first wiring electrode 91 and third wiring electrode 93 are short-circuited via bump 73 as illustrated in FIG. 12B. However, since third wiring electrode 93 is electrically independent of first wiring electrode 91 and second wiring electrode 92, a short circuit between first wiring electrode 91 and second wiring electrode 92 can be prevented. Moreover, since bump 73 is connected to third wiring electrode 93 in mounting substrate 90, heat generated in light emitting layer 22 can be efficiently dissipated to mounting substrate 90.

Figure 13:
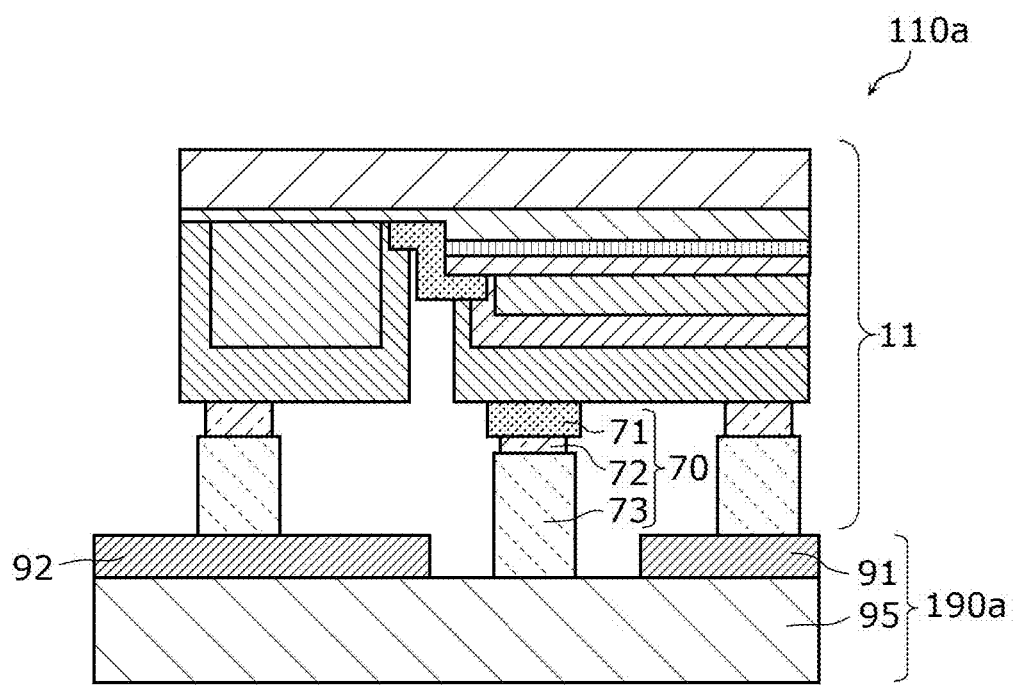
FIG. 13 is a schematic sectional view illustrating a structure of a semiconductor light emitting device according to a variation of Embodiment 2.

To suppress a short circuit between first wiring electrode 91 and second wiring electrode 92 more reliably, the width of the gap between first wiring electrode 91 and second wiring electrode 92 may be greater than the width of insulation bump 70 after bonding, in the region corresponding to insulation bump 70. In this case, third wiring electrode 93 may be omitted from mounting substrate 190. This variation will be described below, with reference to FIG. 13. FIG. 13 is a schematic sectional view illustrating the structure of semiconductor light emitting device 110a according to a variation of this embodiment.

As illustrated in FIG. 13, semiconductor light emitting device 110a according to this variation includes semiconductor light emitting element 11 and mounting substrate 190a. Mounting substrate 190a includes insulation substrate 95, first wiring electrode 91, and second wiring electrode 92.

In semiconductor light emitting device 110a, in a section passing insulation bump 70 and n-electrode bump 80 and perpendicular to the main surface of substrate 20, the width of the gap between first wiring electrode 91 and second wiring electrode 92 is greater than the width of insulation bump 70 after bonding, as illustrated in FIG. 13. In other words, in the section passing insulation bump 70 and n-electrode bump 80 and perpendicular to the main surface of substrate 20, the width of insulation bump 70 is less than the width of the gap between first wiring electrode 91 and second wiring electrode 92 after flip chip bonding. This prevents bump 73 in insulation bump 70 from being in contact with first wiring electrode 91 and second wiring electrode 92 simultaneously. Hence, a short circuit between first wiring electrode 91 and second wiring electrode 92 via insulation bump 70 can be suppressed.

In semiconductor light emitting device 110a according to this variation, third wiring electrode 93 can be omitted. Semiconductor light emitting device 110a according to this variation can therefore have a simpler structure than semiconductor light emitting device 110 according to the embodiment. On the other hand, in the case where semiconductor light emitting device 110a according to this variation includes third wiring electrode 93 as in semiconductor light emitting device 110 according to the embodiment, insulation bump 70 can be firmly connected to third wiring electrode 93, so that semiconductor light emitting element 11 can be firmly connected to mounting substrate 190.

[2-2. Manufacturing Method]

Figure 14A:
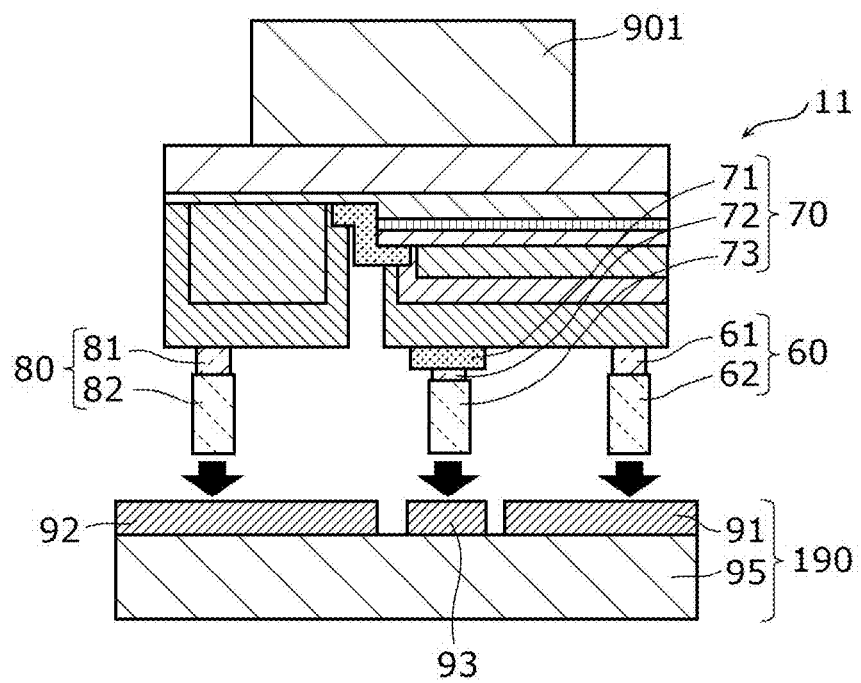
FIG. 14A is a schematic sectional view illustrating a first step in a manufacturing method for the semiconductor light emitting device according to Embodiment 2.
Figure 14B:
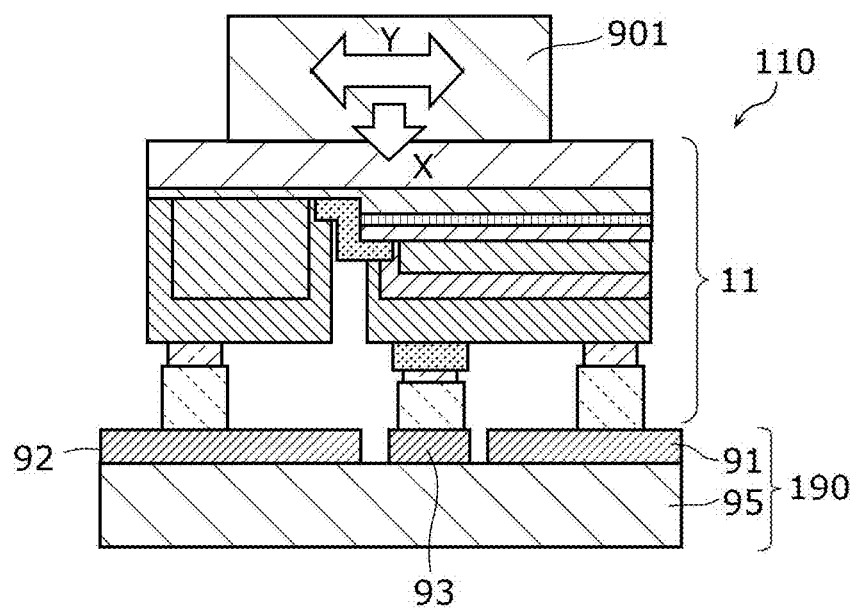
FIG. 14B is a schematic sectional view illustrating a second step in the manufacturing method for the semiconductor light emitting device according to Embodiment 2.

A manufacturing method for semiconductor light emitting device 110 according to this embodiment will be described below, with reference to FIG. 14A and FIG. 14B. FIG. 14A and FIG. 14B are each a schematic sectional view illustrating a step in the manufacturing method for semiconductor light emitting device 110 according to this embodiment. In the manufacturing method for semiconductor light emitting device 110 according to this embodiment, the manufacturing method for semiconductor light emitting element 11 is the same as the manufacturing method in Embodiment 1. A step of bonding semiconductor light emitting element 11 and mounting substrate 190 will be described below.

First, semiconductor light emitting element 11 and mounting substrate 190 are prepared, and semiconductor light emitting element 11 is held so that p-electrode bump 60 and n-electrode bump 80 will be located respectively above first wiring electrode 91 and second wiring electrode 92 in mounting substrate 190, as illustrated in FIG. 14A. In this embodiment, mounting substrate 190 includes insulation substrate 95 made of AlN, and first wiring electrode 91, second wiring electrode 92, and third wiring electrode 93 formed by Au plating. By vacuum-chucking substrate 20 by metal tube 901, semiconductor light emitting element 11 is held in a position in which each bump is situated on the mounting substrate 190 side above mounting substrate 190. Semiconductor light emitting element 11 is then moved toward mounting substrate 190 to be flip-chip bonded.

Next, p-electrode bump 60, n-electrode bump 80, and insulation bump 70 are bonded respectively to first wiring electrode 91, second wiring electrode 92, and third wiring electrode 93, as illustrated in FIG. 14B. In this embodiment, heating is performed to approximately 200° C. in a state in which bumps 62, 82, and 73 are respectively in contact with first wiring electrode 91, second wiring electrode 92, and third wiring electrode 93. Further, while pressing semiconductor light emitting element 11 by applying a load of 30 N in a direction (direction of arrow X in FIG. 14B) perpendicular to the main surface of mounting substrate 190, ultrasonic vibration is applied approximately for 200 ms in a direction (direction of arrow Y in FIG. 14B) parallel to the main surface of mounting substrate 190, as in Embodiment 1. In this way, bumps 62, 82, and 73 are bonded by ultrasonic bonding respectively to first wiring electrode 91, second wiring electrode 92, and third wiring electrode 93.

Semiconductor light emitting device 110 according to this embodiment can be manufactured in the above-described way.

Embodiment 3

A semiconductor light emitting element and a semiconductor light emitting device according to Embodiment 3 will be described below. The semiconductor light emitting element according to this embodiment differs from semiconductor light emitting element 11 according to Embodiment 1 mainly in the structure of the insulation layer. The semiconductor light emitting element and the semiconductor light emitting device according to this embodiment will be described below, mainly focusing on their differences from semiconductor light emitting element 11 and semiconductor light emitting device 10 according to Embodiment 1.

[3-1. Structure of Semiconductor Light Emitting Device]

Figure 15:
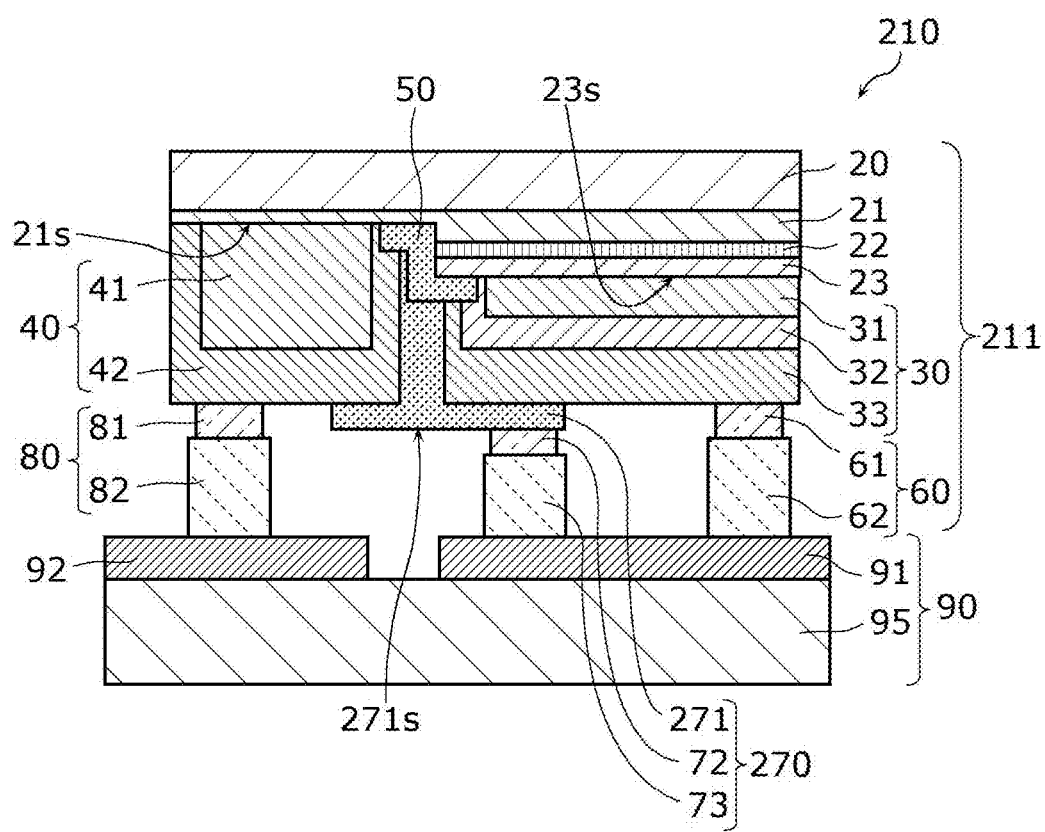
FIG. 15 is a schematic sectional view illustrating a structure of a semiconductor light emitting device according to Embodiment 3.

The structures of the semiconductor light emitting element and the semiconductor light emitting device according to this embodiment will be described below, with reference to FIG. 15. FIG. 15 is a schematic sectional view illustrating the structure of semiconductor light emitting device 210 according to this embodiment. As illustrated in FIG. 15, semiconductor light emitting device 210 according to this embodiment includes semiconductor light emitting element 211 and mounting substrate 90. Semiconductor light emitting element 211 according to this embodiment includes insulation layer 271. Insulation layer 271 is located between p electrode 30 and n electrode 40 and above p-type layer 23 and n-type layer 21 (i.e. below p-type layer 23 and n-type layer 21 in FIG. 15), and has surface 271s parallel to the main surface of substrate 20. Surface 271s of insulation layer 271 extends from a point above p electrode 30 to a point above n electrode 40. In other words, in a plan view of substrate 20, insulation layer 271 overlaps with both part of the region of p electrode 30 and part of the region of n electrode 40. Insulation layer 271 also overlaps with both part of the region of first wiring electrode 91 and part of the region of second wiring electrode 92.

Herein, the state of surface 271s of insulation layer 271 being parallel to the main surface of substrate 20 is defined as follows: Surface 271s is flat, and forms an angle of 10 degrees or less with the main surface of substrate 20. The state of surface 271s being flat is defined as follows: The error of surface 271s from a geometrically accurate plane is less than or equal to ½ of the distance between surface 21s of n-type layer 21 on which n electrode 40 is located and surface 23s of p-type layer 23 on which p electrode 30 is located.

With the inclusion of insulation layer 271 having such surface 271s, semiconductor light emitting element 211 according to this embodiment can easily and efficiently dissipate heat via surface 271s from the region between p electrode 30 and n electrode 40 where the amount of heat generated is largest, while maintaining insulation from p electrode 30 and n electrode 40. For example, in the case where a heat dissipation member including seed metal 72 and bump 73 has a step-shaped surface like insulation film 50 and is located only in the gap between p electrode 30 and n electrode 40, it is difficult to bring the heat dissipation member into contact with insulation film 50 while securing a wide contact area. On the other hand, insulation layer 271 according to this embodiment has surface 271s located above p electrode 30 and n electrode 40. Therefore, a larger area of the heat dissipation member can be brought into contact with insulation layer 271, thus improving the adhesion and heat dissipation of the heat dissipation member to mounting substrate 90. Moreover, as a result of the insulation layer having a surface that is substantially flat and has a small inclination angle, even in the case where the heat dissipation member is pressed and deformed, the force of deformation is not localized, and therefore the adhesion by deformation can be ensured with little damage.

For example, in semiconductor light emitting device 210 according to this embodiment, insulation layer 271 is part of insulation bump 270, and can dissipate heat to mounting substrate 90 via seed metal 72 and bump 73 in insulation bump 270. Although semiconductor light emitting element 211 according to this embodiment includes seed metal 72 and bump 73, these structural elements are not essential. Semiconductor light emitting element 211 may have a structure in which heat is dissipated from insulation layer 271 via a heat dissipation member other than seed metal 72 and bump 73. Semiconductor light emitting element 211 may not include another member for dissipating heat from insulation layer 271. For example, insulation layer 271 in semiconductor light emitting element 211 may be in direct contact with mounting substrate 90.

[3-2. Manufacturing Method]

A manufacturing method for semiconductor light emitting element 211 and semiconductor light emitting device 210 according to this embodiment will be described below, with reference to FIG. 16A to FIG. 16F. FIG. 16A to FIG. 16D are each a schematic sectional view illustrating a step in the manufacturing method for semiconductor light emitting element 211 according to this embodiment. FIG. 16E and FIG. 16F are each a schematic sectional view illustrating a step in the manufacturing method for semiconductor light emitting device 210 according to this embodiment.

First, the manufacturing method for semiconductor light emitting element 211 according to this embodiment will be described below. In the manufacturing method for semiconductor light emitting element 211, the steps up to the formation of p electrode 30 and n electrode 40 are the same as those in the manufacturing method for semiconductor light emitting element 11 according to Embodiment 1, and accordingly their description is omitted.

Figure 16A:
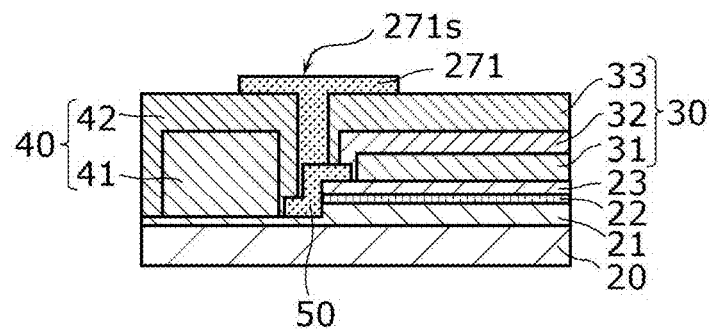
FIG. 16A is a schematic sectional view illustrating a first step in a manufacturing method for a semiconductor light emitting element according to Embodiment 3.

Following the foregoing steps, insulation layer 271 is formed in a region that extends from a point above p electrode 30 to a point above n electrode 40, as illustrated in FIG. 16A. In this embodiment, a photosensitive polyimide film containing an $Al_2O_3$ filler is applied by spin coating, and patterned by photolithography. The photosensitive polyimide film is then cured by being heated at approximately 150° C. for about 1 hour. Here, by setting the viscosity of the photosensitive polyimide to a sufficiently low level of about 2000 mPa·s or less and applying a sufficient amount of the photosensitive polyimide for filling the gap between p electrode 30 and n electrode 40 onto substrate 20 placed horizontally, insulation layer 271 having surface 271s parallel to the main surface of substrate 20 can be formed.

Figure 16B:
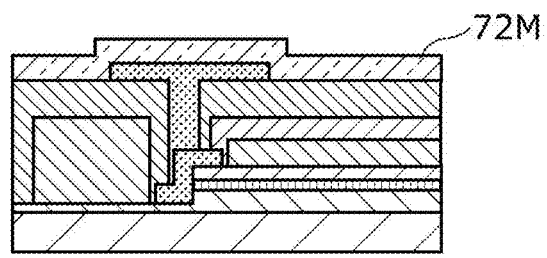
FIG. 16B is a schematic sectional view illustrating a second step in the manufacturing method for the semiconductor light emitting element according to Embodiment 3.

Next, seed metal film 72M is formed above the whole surface of substrate 20, as illustrated in FIG. 16B. The method of forming seed metal film 72M is the same as that in Embodiment 1.

Figure 16C:
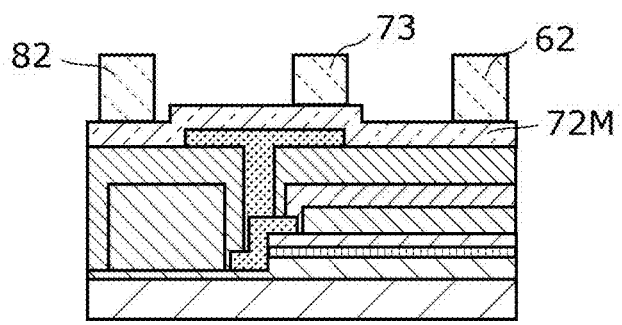
FIG. 16C is a schematic sectional view illustrating a third step in the manufacturing method for the semiconductor light emitting element according to Embodiment 3.

Next, bumps 62, 73, and 82 are formed above seed metal film 72M, as illustrated in FIG. 16C. The method of forming bumps 62, 73, and 82 is the same as that in Embodiment 1.

Figure 16D:
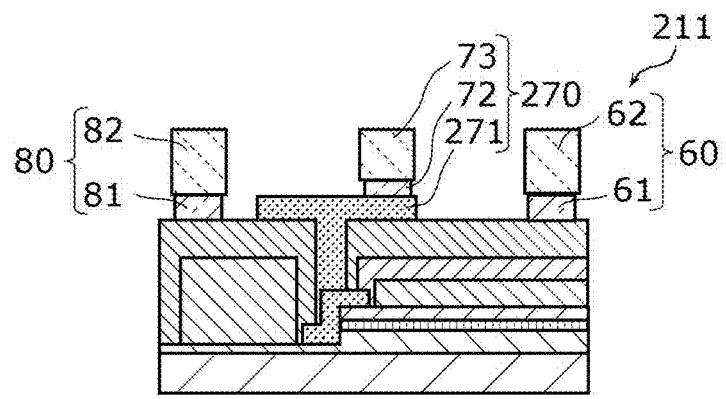
FIG. 16D is a schematic sectional view illustrating a fourth step in the manufacturing method for the semiconductor light emitting element according to Embodiment 3.
Figure 16E:
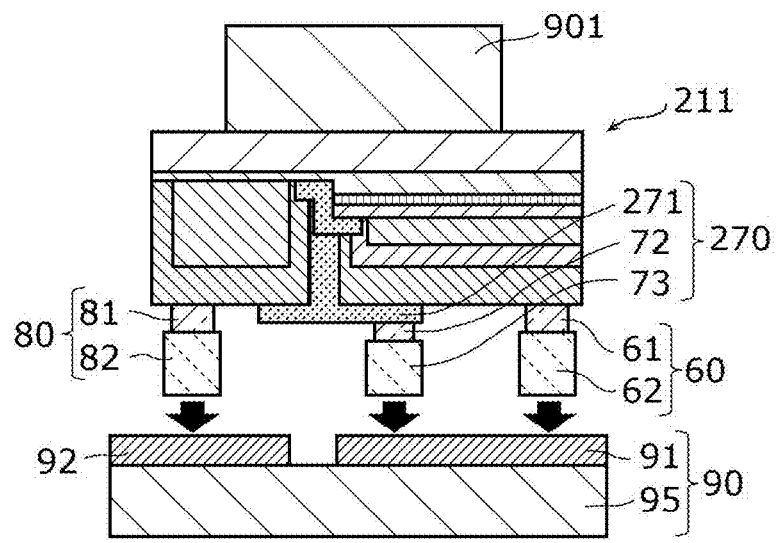
FIG. 16E is a schematic sectional view illustrating a first step in a manufacturing method for the semiconductor light emitting device according to Embodiment 3.
Figure 16F:
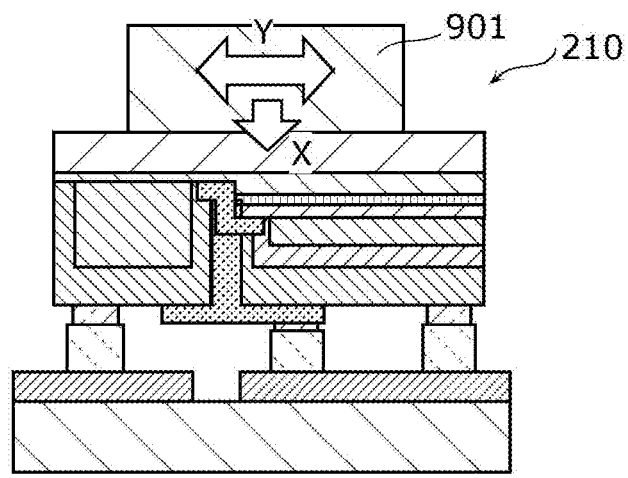
FIG. 16F is a schematic sectional view illustrating a second step in the manufacturing method for the semiconductor light emitting device according to Embodiment 3.

Next, seed metal film 72M except the lower part of each bump is removed to form seed metals 61, 72, and 81, as illustrated in FIG. 16D. The method of forming seed metals 61, 72, and 81 is the same as that in Embodiment 1.

Semiconductor light emitting element 211 according to this embodiment can be manufactured in this way.

Next, the manufacturing method for semiconductor light emitting device 210 according to this embodiment will be described below.

First, semiconductor light emitting element 211 and mounting substrate 90 are prepared, and semiconductor light emitting element 211 is held so that p-electrode bump 60 and n-electrode bump 80 will be located respectively above first wiring electrode 91 and second wiring electrode 92 in mounting substrate 90, as illustrated in FIG. 16E. Semiconductor light emitting element 211 is then moved toward mounting substrate 90 to be flip-chip bonded, as in Embodiment 1.

Next, each of p-electrode bump 60 and insulation bump 270 and first wiring electrode 91 are bonded by ultrasonic bonding, and n-electrode bump 80 and second wiring electrode 92 are bonded by ultrasonic bonding, as illustrated in FIG. 16F. The bonding method is the same as that in Embodiment 1.

Semiconductor light emitting device 210 according to this embodiment can be manufactured in this way.

Embodiment 4

A semiconductor light emitting element and a semiconductor light emitting device according to Embodiment 4 will be described below. The semiconductor light emitting device according to this embodiment differs from semiconductor light emitting device 210 according to Embodiment 3 in the structure of the insulation bump included in the semiconductor light emitting element, and is the same as semiconductor light emitting device 210 according to Embodiment 3 on the other points. The semiconductor light emitting device according to this embodiment will be described below, mainly focusing on its differences from semiconductor light emitting device 210 according to Embodiment 3.

[4-1. Structure of Semiconductor Light Emitting Device]

Figure 17:
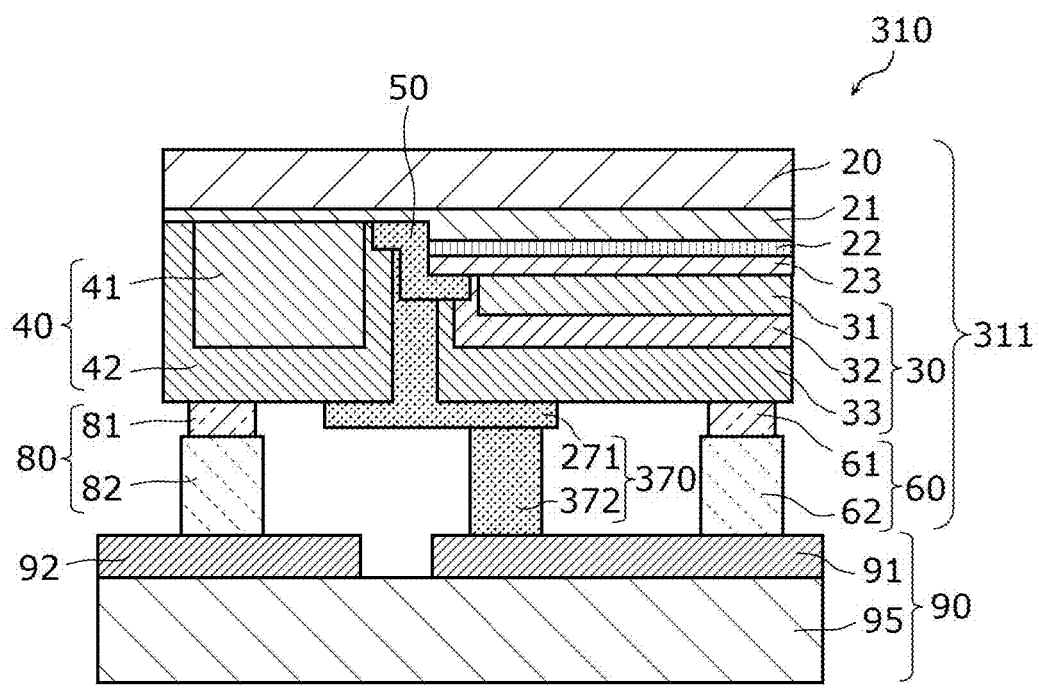
FIG. 17 is a schematic sectional view illustrating a structure of a semiconductor light emitting device according to Embodiment 4.

The structure of the semiconductor light emitting device according to this embodiment will be described below, with reference to FIG. 17. FIG. 17 is a schematic sectional view illustrating the structure of semiconductor light emitting device 310 according to this embodiment. As illustrated in FIG. 17, semiconductor light emitting device 310 according to this embodiment includes semiconductor light emitting element 311 and mounting substrate 90, as with semiconductor light emitting device 210 according to Embodiment 3. Semiconductor light emitting element 311 according to this embodiment includes insulation layer 271, as with semiconductor light emitting element 211 according to Embodiment 3.

Semiconductor light emitting element 311 according to this embodiment includes insulation bump 370 as with semiconductor light emitting element 211 according to Embodiment 3, but differs from semiconductor light emitting element 211 according to Embodiment 3 in the structure of insulation bump 370. Insulation bump 370 according to this embodiment includes insulation layer 271 and insulation film 372. Insulation film 372 is an insulating film located above insulation layer 271. That is, in this embodiment, insulation bump 370 is formed only of an insulator. In this embodiment, insulation film 372 is a polyimide film containing an $Al_2O_3$ filler with a thickness of approximately 3 μm.

The surface of such configured insulation bump 370 opposite to the substrate-side surface is insulated from p electrode 30 and n electrode 40, as with insulation bump 70 according to Embodiment 1. Hence, semiconductor light emitting element 311 and semiconductor light emitting device 310 according to this embodiment respectively have the same effects as semiconductor light emitting element 11 and semiconductor light emitting device 10 according to Embodiment 1. The structure of insulation film 372 is not limited to the above. For example, insulation film 372 may be made of spin-on-glass (SOG) or the like.

[4-2. Manufacturing Method]

Figure 18A:
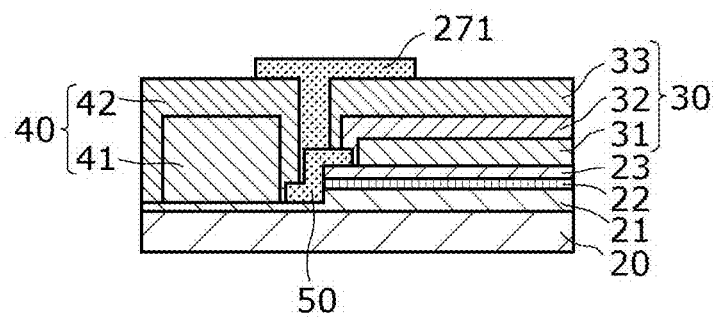
FIG. 18A is a schematic sectional view illustrating a first step in a manufacturing method for a semiconductor light emitting element according to Embodiment 4.

A manufacturing method for semiconductor light emitting element 311 and semiconductor light emitting device 310 according to this embodiment will be described below, with reference to FIG. 18A to FIG. 18G. FIG. 18A to FIG. 18E are each a schematic sectional view illustrating a step in the manufacturing method for semiconductor light emitting element 311 according to this embodiment. FIG. 18F and FIG. 18G are each a schematic sectional view illustrating a step in the manufacturing method for semiconductor light emitting device 310 according to this embodiment.

First, the manufacturing method for semiconductor light emitting element 311 according to this embodiment will be described below. In the manufacturing method for semiconductor light emitting element 311, the steps up to the formation of insulation layer 271 illustrated in FIG. 18A are the same as those in the manufacturing method for semiconductor light emitting element 211 according to Embodiment 3, and accordingly their description is omitted.

Figure 18B:
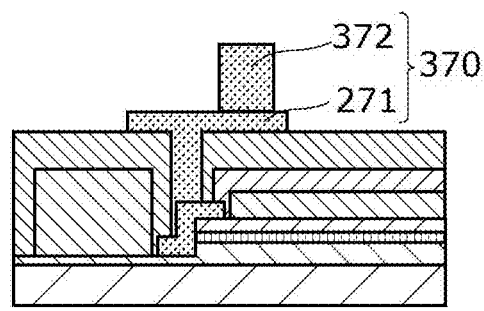
FIG. 18B is a schematic sectional view illustrating a second step in the manufacturing method for the semiconductor light emitting element according to Embodiment 4.

Following the foregoing steps, insulation film 372 is formed above insulation layer 271, as illustrated in FIG. 18B. In this embodiment, a photosensitive polyimide film containing an $Al_2O_3$ filler is applied by spin coating, and patterned by photolithography. The photosensitive polyimide film is then cured by being heated at approximately 150° C. for about 30 minutes. As a result of the heating time being shorter than that of insulation layer 271 or the like, part of insulation film 372 can be left uncured. Thus, the hardness of insulation film 372 can be reduced. Therefore, when insulation film 372 comes into contact with mounting substrate 90, insulation film 372 can be deformed to suppress hinderance to the connection between p-electrode bump 60 and first wiring electrode 91 and the connection between n-electrode bump 80 and second wiring electrode 92. Moreover, stress applied to semiconductor light emitting element 311 and mounting substrate 90 can be reduced.

Figure 18C:
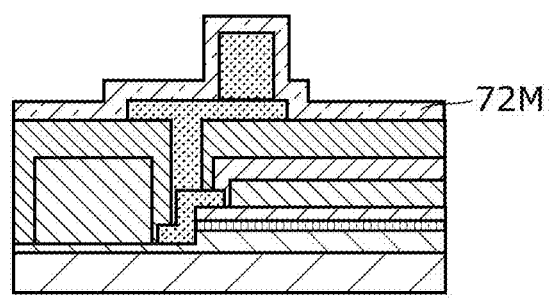
FIG. 18C is a schematic sectional view illustrating a third step in the manufacturing method for the semiconductor light emitting element according to Embodiment 4.

Next, seed metal film 72M is formed above the whole surface of substrate 20, as illustrated in FIG. 18C. The method of forming seed metal film 72M is the same as that in Embodiment 1.

Figure 18D:
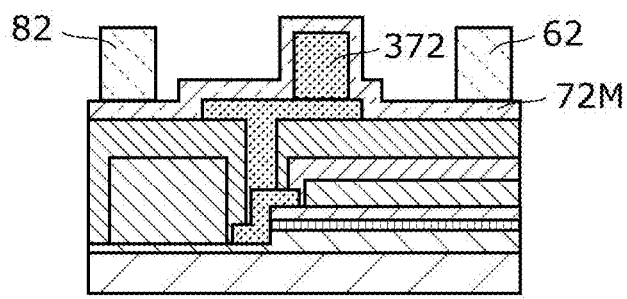
FIG. 18D is a schematic sectional view illustrating a fourth step in the manufacturing method for the semiconductor light emitting element according to Embodiment 4.

Next, bumps 62 and 82 are formed above seed metal film 72M, as illustrated in FIG. 18D. The method of forming bumps 62 and 82 is the same as that in Embodiment 1.

Figure 18E:
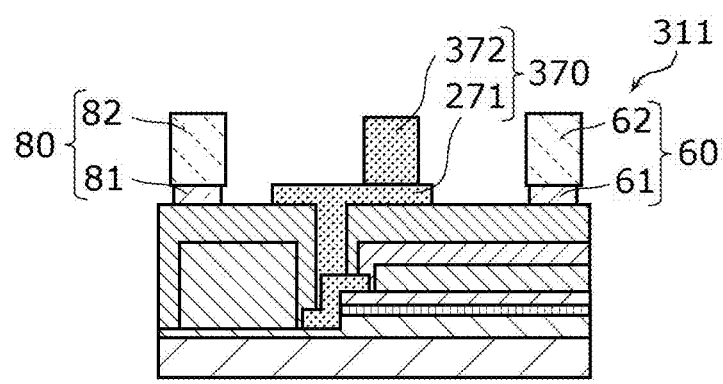
FIG. 18E is a schematic sectional view illustrating a fifth step in the manufacturing method for the semiconductor light emitting element according to Embodiment 4.
Figure 18F:
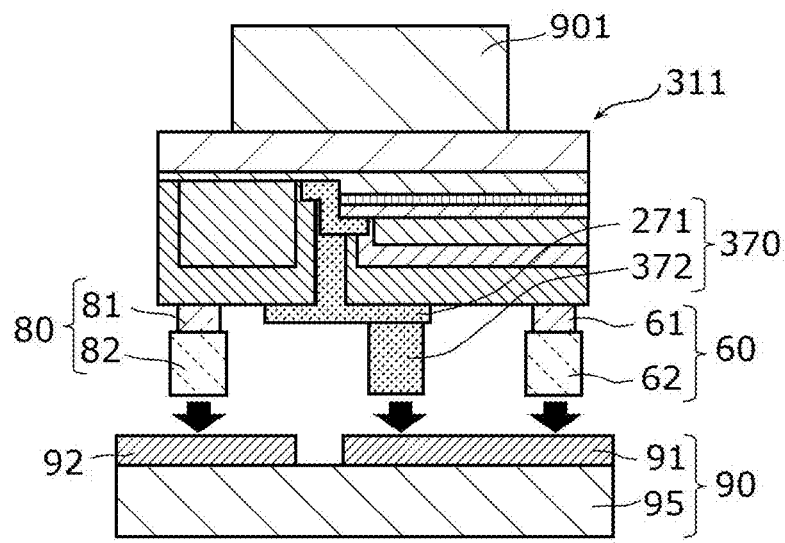
FIG. 18F is a schematic sectional view illustrating a first step in a manufacturing method for the semiconductor light emitting device according to Embodiment 4.
Figure 18G:
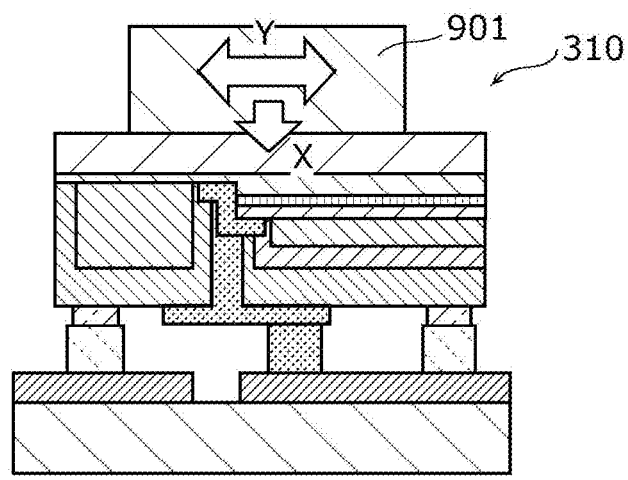
FIG. 18G is a schematic sectional view illustrating a second step in the manufacturing method for the semiconductor light emitting device according to Embodiment 4.

Next, seed metal film 72M except the lower part of each of bumps 62 and 82 is removed to form seed metals 61 and 81, as illustrated in FIG. 18E. The method of forming seed metals 61 and 81 is the same as that in Embodiment 1.

Semiconductor light emitting element 311 according to this embodiment can be manufactured in this way.

Next, the manufacturing method for semiconductor light emitting device 310 according to this embodiment will be described below.

First, semiconductor light emitting element 311 and mounting substrate 90 are prepared, and semiconductor light emitting element 311 is held so that p-electrode bump 60 and n-electrode bump 80 will be located respectively above first wiring electrode 91 and second wiring electrode 92 in mounting substrate 90, as illustrated in FIG. 18F. Semiconductor light emitting element 311 is then moved toward mounting substrate 90 to be flip-chip bonded, as in Embodiment 1.

Next, p-electrode bump 60 and first wiring electrode 91 are bonded by ultrasonic bonding, and n-electrode bump 80 and second wiring electrode 92 are bonded by ultrasonic bonding, as illustrated in FIG. 18G. The bonding method is the same as that in Embodiment 1. Insulation bump 370 is in contact with mounting substrate 90. In the example illustrated in FIG. 18G, insulation film 372 in insulation bump 370 is in contact with first wiring electrode 91 in mounting substrate 90.

Semiconductor light emitting device 310 according to this embodiment can be manufactured in this way.

Embodiment 5

A semiconductor light emitting element and a semiconductor light emitting device according to Embodiment 5 will be described below. The semiconductor light emitting element according to this embodiment differs from semiconductor light emitting element 311 according to Embodiment 4 in the structure of the insulation bump. The semiconductor light emitting element and the semiconductor light emitting device according to this embodiment will be described below, mainly focusing on their differences from semiconductor light emitting element 311 and semiconductor light emitting device 310 according to Embodiment 4.

[5-1. Structure of Semiconductor Light Emitting Device]

Figure 19:
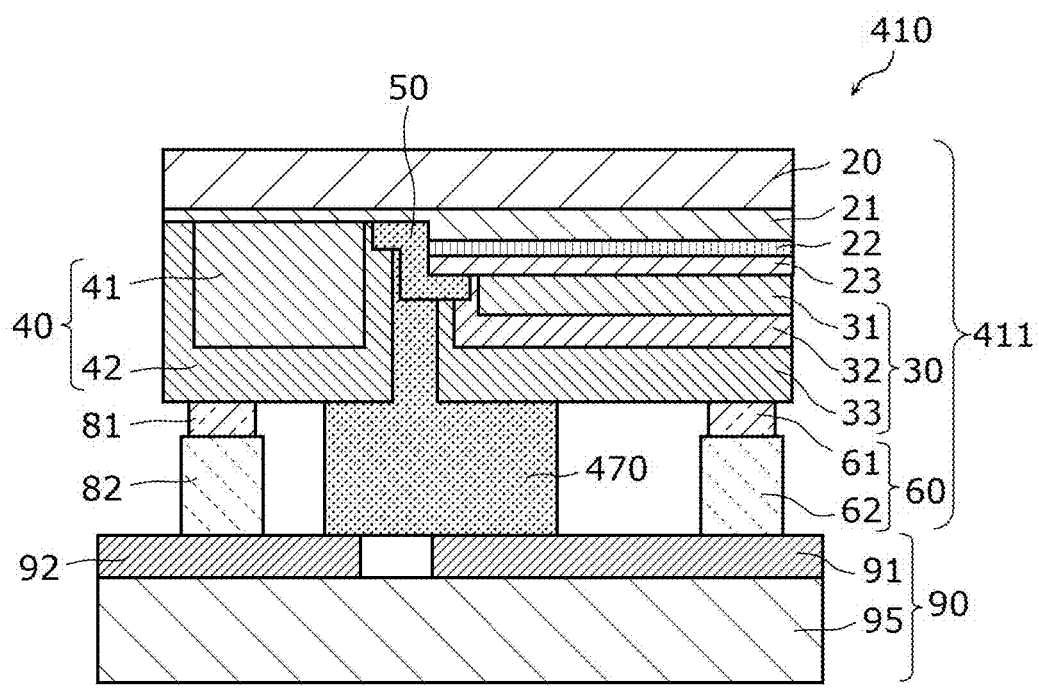
FIG. 19 is a schematic sectional view illustrating a structure of a semiconductor light emitting device according to Embodiment 5.

The structure of the semiconductor light emitting device according to this embodiment will be described below, with reference to FIG. 19. FIG. 19 is a schematic sectional view illustrating the structure of semiconductor light emitting device 410 according to this embodiment. As illustrated in FIG. 19, semiconductor light emitting device 410 according to this embodiment includes semiconductor light emitting element 411 and mounting substrate 90, as with semiconductor light emitting device 310 according to Embodiment 4. Semiconductor light emitting element 411 according to this embodiment includes insulation bump 470 formed only of an insulator, as with semiconductor light emitting element 311 according to Embodiment 4. In this embodiment, insulation bump 470 differs from insulation bump 370 according to Embodiment 4 in that insulation bump 470 is integrally formed.

Insulation bump 470 is located above the end of p-type layer 23 facing n electrode 40. Insulation bump 470 is also located across the end of p electrode 30 facing n electrode 40. In semiconductor light emitting element 411, the amount of heat generated is large near the end of p-type layer 23 facing n electrode 40 and near the end of p electrode 30 facing n electrode 40. As a result of insulation bump 470 being located in the above-described manner, i.e. as a result of insulation bump 470 being located in the region in which the amount of heat generated is large, heat can be dissipated efficiently via insulation bump 470.

In this embodiment, insulation bump 470 is located between p electrode 30 and n electrode 40 and above the p-type layer and the n-type layer (i.e. below the p-type layer and the n-type layer in FIG. 19), as illustrated in FIG. 19. The surface of insulation bump 470 extends from a point above p electrode 30 to a point above n electrode 40. In a plan view of substrate 20, insulation bump 470 overlaps with both part of the region of p electrode 30 and part of the region of n electrode 40. Insulation bump 470 also overlaps with both part of the region of first wiring electrode 91 and part of the region of second wiring electrode 92. In this embodiment, insulation bump 470 is a polyimide film with a thickness of approximately 8 μm. Insulation bump 470 may contain an $Al_2O_3$ filler.

The surface of such configured insulation bump 470 opposite to the substrate-side surface is insulated from p electrode 30 and n electrode 40, as with insulation bump 70 according to Embodiment 1. Hence, semiconductor light emitting element 411 and semiconductor light emitting device 410 according to this embodiment respectively have the same effects as semiconductor light emitting element 11 and semiconductor light emitting device 10 according to Embodiment 1.

Insulation bump 470 may have a surface parallel to the main surface of substrate 20. That is, insulation bump 470 may be in a form of insulation layer 271 according to Embodiment 3.

[5-2. Manufacturing Method]

A manufacturing method for semiconductor light emitting element 411 and semiconductor light emitting device 410 according to this embodiment will be described below, with reference to FIG. 20A to FIG. 20F. FIG. 20A to FIG. 20D are each a schematic sectional view illustrating a step in the manufacturing method for semiconductor light emitting element 411 according to this embodiment. FIG. 20E and FIG. 20F are each a schematic sectional view illustrating a step in the manufacturing method for semiconductor light emitting device 410 according to this embodiment.

First, the manufacturing method for semiconductor light emitting element 411 according to this embodiment will be described below. In the manufacturing method for semiconductor light emitting element 411, the steps up to the formation of p electrode 30 and n electrode 40 are the same as those in the manufacturing method for semiconductor light emitting element 11 according to Embodiment 1, and accordingly their description is omitted.

Figure 20A:
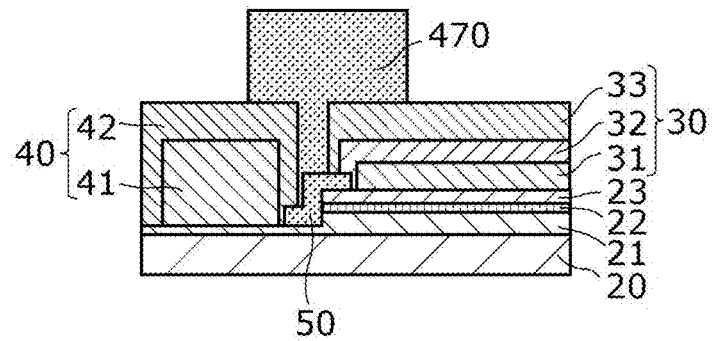
FIG. 20A is a schematic sectional view illustrating a first step in a manufacturing method for a semiconductor light emitting element according to Embodiment 5.

Following the foregoing steps, insulation bump 470 is formed in a region that extends from a point above p electrode 30 to a point above n electrode 40, as illustrated in FIG. 20A. In this embodiment, a photosensitive polyimide film containing an $Al_2O_3$ filler is applied by spin coating, and patterned by photolithography. The photosensitive polyimide film is then cured by being heated at approximately 150° C. for about 30 minutes.

Here, by setting the viscosity of the photosensitive polyimide to a sufficiently low level and applying a sufficient amount of the photosensitive polyimide for filling the gap between p electrode 30 and n electrode 40 onto substrate 20 placed horizontally, insulation bump 470 having a surface parallel to the main surface of substrate 20 can be formed.

Moreover, as a result of the heating time of insulation bump 470 being shorter than that of insulation layer 271 according to Embodiment 3 or the like, part of insulation bump 470 can be left uncured. Thus, the hardness of insulation bump 470 can be reduced.

Figure 20B:
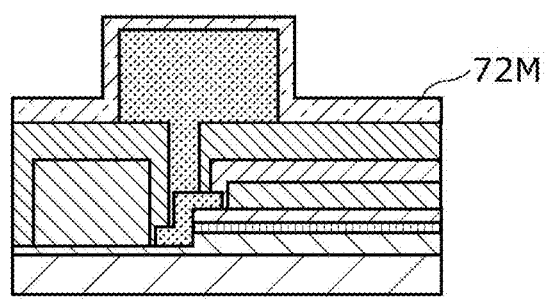
FIG. 20B is a schematic sectional view illustrating a second step in the manufacturing method for the semiconductor light emitting element according to Embodiment 5.

Next, seed metal film 72M is formed above the whole surface of substrate 20, as illustrated in FIG. 20B. The method of forming seed metal film 72M is the same as that in Embodiment 1.

Figure 20C:
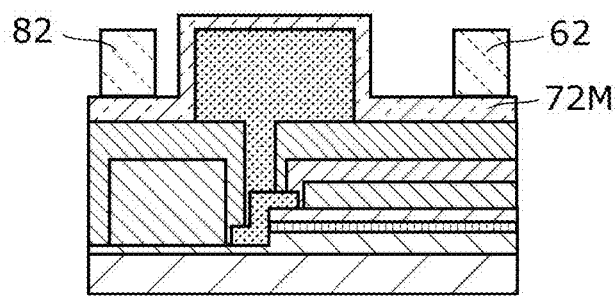
FIG. 20C is a schematic sectional view illustrating a third step in the manufacturing method for the semiconductor light emitting element according to Embodiment 5.

Next, bumps 62 and 82 are formed above seed metal film 72M, as illustrated in FIG. 20C. The method of forming bumps 62 and 82 is the same as that in Embodiment 1.

Figure 20D:
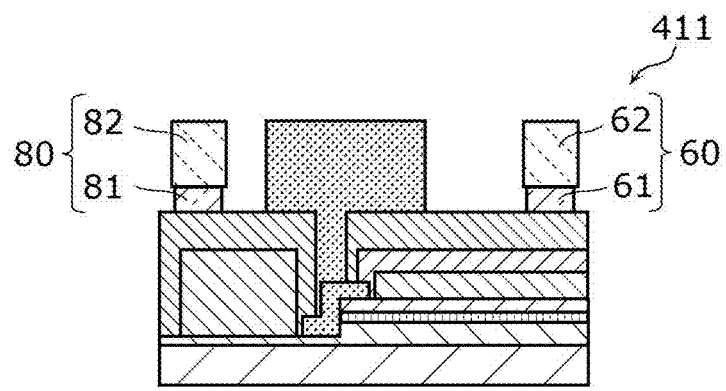
FIG. 20D is a schematic sectional view illustrating a fourth step in the manufacturing method for the semiconductor light emitting element according to Embodiment 5.
Figure 20E:
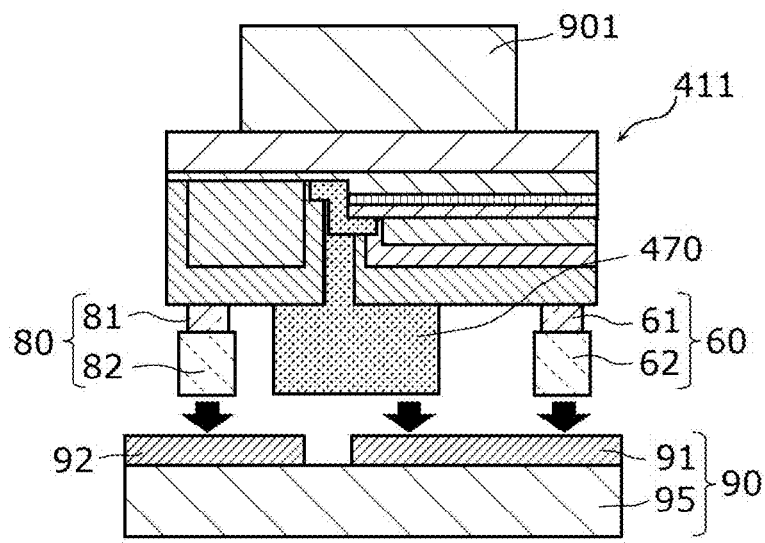
FIG. 20E is a schematic sectional view illustrating a first step in a manufacturing method for the semiconductor light emitting device according to Embodiment 5.
Figure 20F:
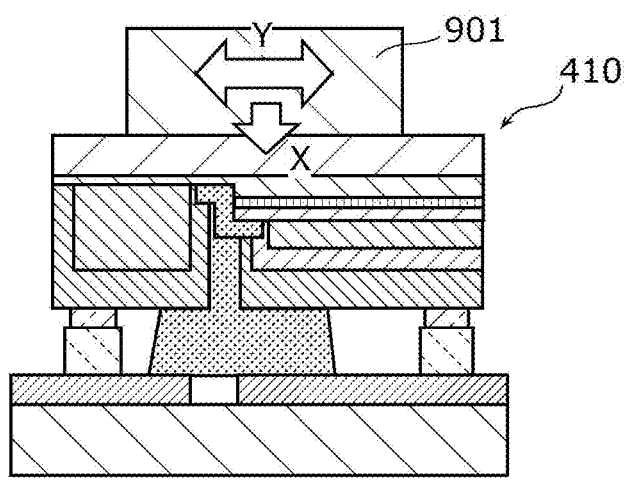
FIG. 20F is a schematic sectional view illustrating a second step in the manufacturing method for the semiconductor light emitting device according to Embodiment 5.

Next, seed metal film 72M except the lower part of each of bumps 62 and 82 is removed to form seed metals 61 and 81, as illustrated in FIG. 20D. The method of forming seed metals 61 and 81 is the same as that in Embodiment 1.

Semiconductor light emitting element 411 according to this embodiment can be manufactured in this way.

Next, the manufacturing method for semiconductor light emitting device 410 according to this embodiment will be described below.

First, semiconductor light emitting element 411 and mounting substrate 90 are prepared, and semiconductor light emitting element 411 is held so that p-electrode bump 60 and n-electrode bump 80 will be located respectively above first wiring electrode 91 and second wiring electrode 92 in mounting substrate 90, as illustrated in FIG. 20E. Semiconductor light emitting element 411 is then moved toward mounting substrate 90 to be flip-chip bonded, as in Embodiment 1.

Next, p-electrode bump 60 and first wiring electrode 91 are bonded by ultrasonic bonding, and n-electrode bump 80 and second wiring electrode 92 are bonded by ultrasonic bonding, as illustrated in FIG. 20F. The bonding method is the same as that in Embodiment 1. Insulation bump 470 is in contact with mounting substrate 90. In the example illustrated in FIG. 20F, insulation bump 470 is in contact with first wiring electrode 91 and second wiring electrode 92 in mounting substrate 90.

Semiconductor light emitting device 410 according to this embodiment can be manufactured in this way.

Embodiment 6

A semiconductor light emitting element and a semiconductor light emitting device according to Embodiment 6 will be described below. The semiconductor light emitting element according to this embodiment differs from the semiconductor light emitting element according to Embodiment 1 in the placement of the n electrode, etc. The semiconductor light emitting device according to this embodiment differs from semiconductor light emitting device 10 according to Embodiment 1 in that the p electrode and the second wiring electrode in the mounting substrate face each other, etc. The semiconductor light emitting element and the semiconductor light emitting device according to this embodiment will be described below, mainly focusing on their differences from semiconductor light emitting element 11 and semiconductor light emitting device 10 according to Embodiment 1.

[6-1. Structure of Semiconductor Light Emitting Device]

Figure 21A:
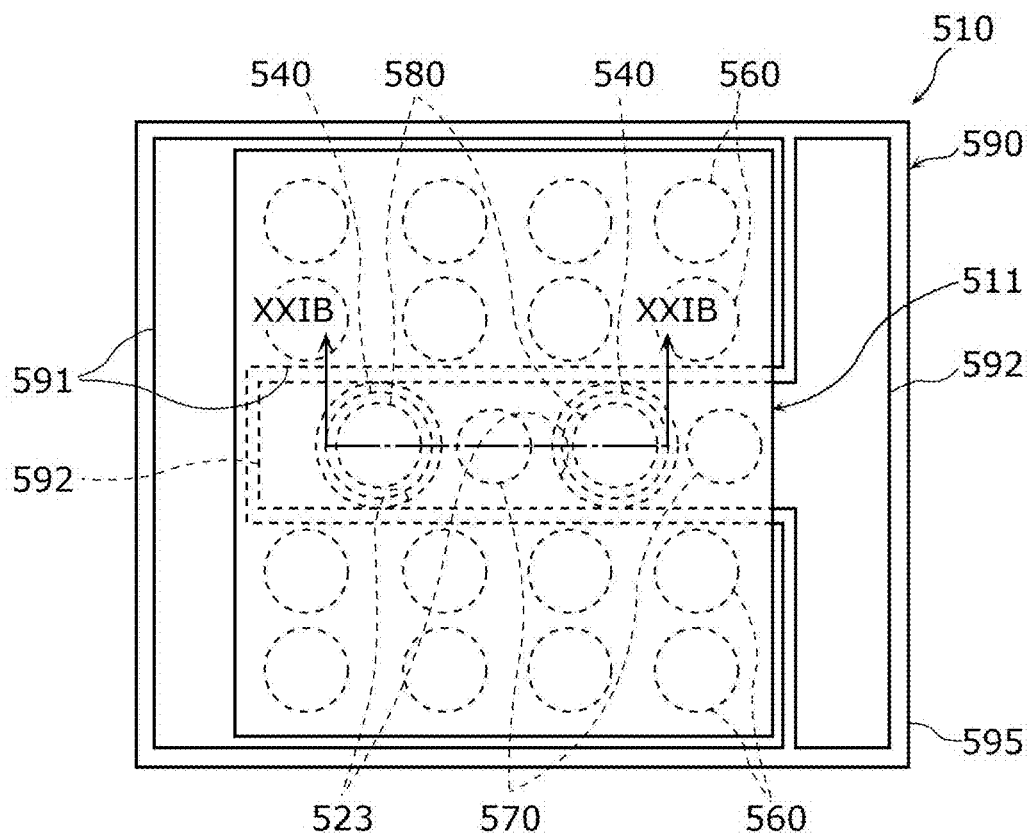
FIG. 21A is a schematic plan view illustrating a structure of a semiconductor light emitting device according to Embodiment 6.
Figure 21B:
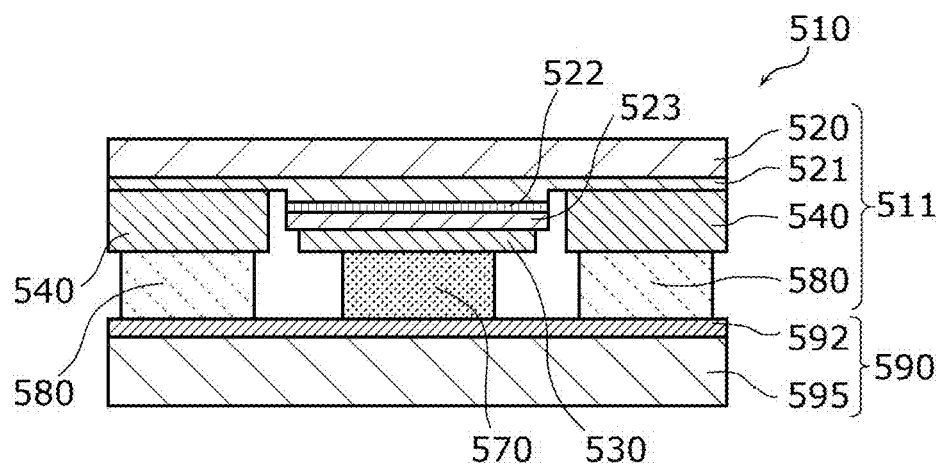
FIG. 21B is a schematic sectional view illustrating the structure of the semiconductor light emitting device according to Embodiment 6.
Figure 22:
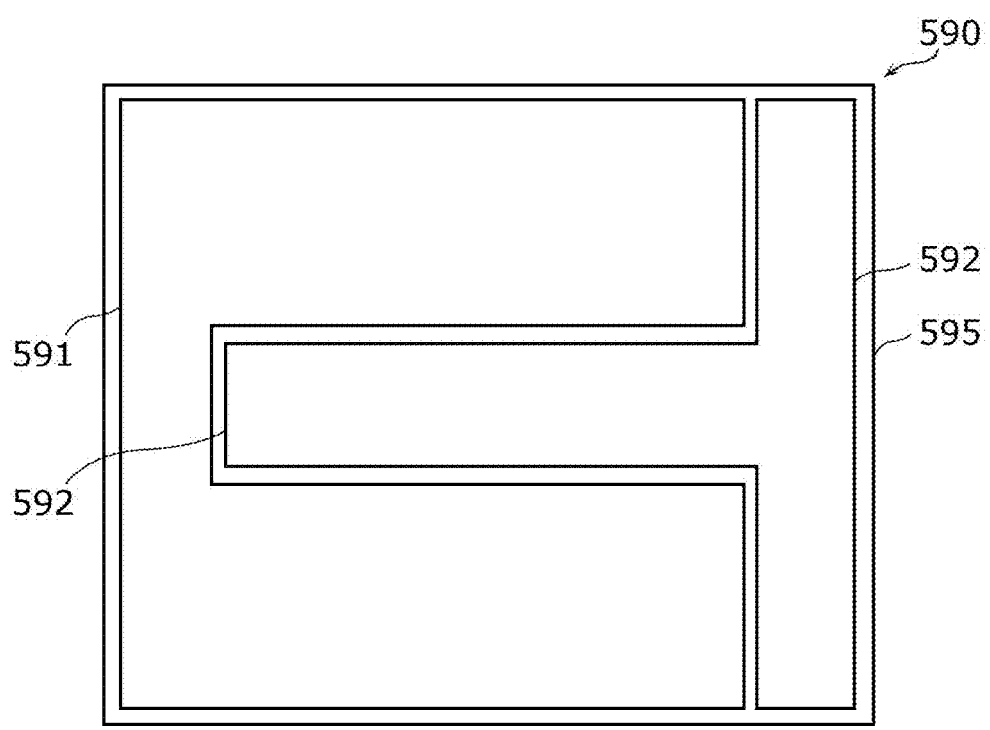
FIG. 22 is a schematic plan view illustrating a structure of a mounting substrate according to Embodiment 6.

First, the structures of the semiconductor light emitting element and the semiconductor light emitting device according to this embodiment will be described below, with reference to FIG. 21A to FIG. 22. FIG. 21A and FIG. 21B are respectively a schematic plan view and sectional view illustrating the structure of semiconductor light emitting device 510 according to this embodiment. FIG. 21B illustrates a section along line XXIB-XXIB in FIG. 21A. FIG. 22 is a schematic plan view illustrating the structure of mounting substrate 590 according to this embodiment.

As illustrated in FIG. 21A and FIG. 21B, semiconductor light emitting device 510 according to this embodiment includes semiconductor light emitting element 511 and mounting substrate 590.

As illustrated in FIG. 21B, semiconductor light emitting element 511 includes substrate 520, n-type layer 521, light emitting layer 522, p-type layer 523, p electrode 530, n electrode 540, n-electrode bump 580, and insulation bump 570. As illustrated in FIG. 21A, semiconductor light emitting element 511 further includes p-electrode bump 560.

Substrate 520 is a base on which the semiconductor layers of semiconductor light emitting element 511 are stacked. Substrate 520 has the same structure as substrate 20 according to Embodiment 1.

N-type layer 521 is a semiconductor layer located above substrate 520 and including an n-type semiconductor. N-type layer 521 is placed on substantially the whole surface of substrate 520. N-type layer 521 has the same structure as n-type layer 21 according to Embodiment 1.

Light emitting layer 522 is a semiconductor layer located above n-type layer 521. Light emitting layer 522 is located in a region in which n electrode 540 is not located, above n-type layer 521. In this embodiment, light emitting layer 522 is formed on substantially the whole surface of n-type layer 521 except two parts in each of which n electrode 540 is formed (see FIG. 21A). Light emitting layer 522 is not limited as long as it is a semiconductor layer, as with light emitting layer 22 according to Embodiment 1.

P-type layer 523 is a semiconductor layer located above light emitting layer 522 and including a p-type semiconductor. In this embodiment, p-type layer 523 is formed on substantially the whole surface of light emitting layer 522. P-type layer 523 is not limited as long as it is a semiconductor layer including a p-type semiconductor, as with p-type layer 23 according to Embodiment 1.

P electrode 530 is an electrode located above p-type layer 523. In this embodiment, p electrode 530 is formed on substantially the whole surface of p-type layer 523. P electrode 530 is not limited as long as it is a conductive film.

N electrode 540 is located in a region that is above n-type layer 521 and in which light emitting layer 522 and p-type layer 523 are not located. In this embodiment, n electrode 540 is located in each of two circular regions surrounded by p electrode 530. N electrode 540 is not limited as long as it is a conductive film.

P-electrode bump 560 is a conductor located above p electrode 530 and electrically connected to p electrode 530. P-electrode bump 560 is not limited as long as it is a conductor. The number of p-electrode bumps 560 is not limited. As illustrated in FIG. 21A, in this embodiment, semiconductor light emitting element 511 includes sixteen p-electrode bumps 560 in total, i.e. eight p-electrode bumps 560 illustrated above n electrode 540 in the drawing and eight p-electrode bumps 560 illustrated below n electrode 540 in the drawing.

N-electrode bump 580 is a conductor located above n electrode 540 and electrically connected to n electrode 540. N-electrode bump 580 is not limited as long as it is a conductor. In this embodiment, semiconductor light emitting element 511 includes two n-electrode bumps 580 in a region sandwiched by the sixteen p-electrode bumps 560.

Insulation bump 570 is a columnar body located in a region whose distance from the end of p-type layer 523 on the n-electrode bump 580 side is shorter than the distance from the end of p-type layer 523 to the position at which p-electrode bump 560 is located, in a plan view of substrate 520. In other words, the distance of the gap between adjacent p-electrode bump 560 and insulation bump 570 is greater than the distance between the end of p-type layer 523 facing n-electrode bump 580 and insulation bump 570. In this embodiment, insulation bump 570 is located in a region sandwiched between p electrode 530 and second wiring electrode 592 in mounting substrate 590. That is, insulation bump 570 bonds to both p electrode 530 and second wiring electrode 592 in mounting substrate 590. In this embodiment, insulation bump 570 is formed of an insulator. Thus, in this embodiment, too, the surface of insulation bump 570 opposite to the surface on the substrate 520 side is insulated from p electrode 530 and n electrode 540, as with insulation bump 70 according to Embodiment 1. Therefore, heat generated in semiconductor light emitting element 511 can be transferred to mounting substrate 590 while suppressing a short circuit between p electrode 530 and second wiring electrode 592 in mounting substrate 590.

Mounting substrate 590 is a substrate on which semiconductor light emitting element 511 is mounted, and includes insulation substrate 595, first wiring electrode 591, and second wiring electrode 592, as illustrated in FIG. 21A and FIG. 22.

Insulation substrate 595 is an insulating substrate serving as a base of mounting substrate 590. Insulation substrate 595 has the same structure as insulation substrate 95 according to Embodiment 1.

First wiring electrode 591 is an electrode electrically connected to p-electrode bump 560. In this embodiment, first wiring electrode 591 is substantially C-shaped in a plan view of insulation substrate 595, as illustrated in FIG. 22.

Second wiring electrode 592 is an electrode electrically connected to n-electrode bump 580. In this embodiment, the part of second wiring electrode 592 connected to n-electrode bump 580 is located in a region sandwiched by first wiring electrode 591, as illustrated in FIG. 21A and FIG. 22. Second wiring electrode 592 is T-shaped in a plan view of insulation substrate 595.

As described above, in semiconductor light emitting device 510 according to this embodiment, heat generated in a region in which a conductive bump cannot be conventionally located because of a short circuit between the electrode of the semiconductor light emitting element and the wiring electrode of the mounting substrate can be released to mounting substrate 590 via insulation bump 570. That is, in semiconductor light emitting device 510 according to this embodiment, the heat dissipation property can be improved. A degradation in luminescence property and reliability of semiconductor light emitting device 510 can thus be suppressed.

Although insulation bump 570 is located in the region sandwiched between p electrode 530 and second wiring electrode 592 in this embodiment, the placement of insulation bump 570 is not limited to such. For example, in the case where there is a region sandwiched between the n electrode and the first wiring electrode, insulation bump 570 may be located in this region. In this way, the heat dissipation performance can be enhanced while suppressing a short circuit between the n electrode and the first wiring electrode.

Variations

While the semiconductor light emitting element and the semiconductor light emitting device according to the present disclosure have been described based on the embodiments above, the present disclosure is not limited to these embodiments.

For example, although each of the foregoing embodiments mainly describes a semiconductor light emitting element using a GaN-based semiconductor, the material of the semiconductor light emitting element is not limited to such. For example, a GaAs-based semiconductor may be used.

The number of insulation bumps, the number of p-electrode bumps, and the number of n-electrode bumps are not limited to the numbers in each of the foregoing embodiments, and may be any numbers.

Other modifications obtained by applying various changes conceivable by a person skilled in the art to the foregoing embodiments, etc. and any combinations of the structural elements and functions in the foregoing embodiments, etc. without departing from the scope of the present disclosure are also included in the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability The semiconductor light emitting element and the semiconductor light emitting device according to the present disclosure are particularly suitable as light sources such as lightings required to have high luminescence property and reliability.

The invention claimed is:

1. A semiconductor light emitting device, comprising:
a semiconductor light emitting element; and
a mounting substrate, wherein:
the semiconductor light emitting element includes:
   a substrate;
   an n-type layer located above the substrate and including an n-type semiconductor;
   a light emitting layer located above the n-type layer;
   a p-type layer located above the light emitting layer and including a p-type semiconductor;
   a p electrode located above the p-type layer;
   an n electrode located in a region that is above the n-type layer and in which the light emitting layer and the p-type layer are not located;
   a conductive p-electrode bump located above the p electrode and electrically connected to the p electrode;
   a conductive n-electrode bump located above the n electrode and electrically connected to the n electrode; and
   an insulation bump located in at least one region selected from a region between the n-electrode bump and the p-type layer and a region whose distance from an end of the p-type layer closer to the n-electrode bump is shorter than a distance from the end of the p-type layer to a position at which the p-electrode bump is located, in a plan view of the substrate,
the insulation bump includes a film and a columnar conductor, in order from a side on which the substrate is located,
the film is made of a resin containing a filler, and the columnar conductor is made of Au,
the insulation bump is located above an end of the p-type layer facing the n electrode,
the mounting substrate includes a first wiring electrode electrically connected to the p-electrode bump and a second wiring electrode electrically connected to the n-electrode bump,
the insulation bump is located in a region sandwiched between the n electrode and the first wiring electrode, or in a region sandwiched between the p electrode and the second wiring electrode, and
the columnar conductor is in contact with the first wiring electrode or the second wiring electrode.

2. The semiconductor light emitting device according to claim 1, wherein the insulation bump is located across an end of the p electrode facing the n electrode in the plan view of the substrate.

3. The semiconductor light emitting device according to claim 1, wherein the mounting substrate further includes a third wiring electrode located between the first wiring electrode and the second wiring electrode and electrically independent of the first wiring electrode and the second wiring electrode.

4. The semiconductor light emitting device according to claim 1, wherein the insulation bump has a width narrower than a width of a gap between the first wiring electrode and the second wiring electrode, in a section that passes the insulation bump and the n-electrode bump and is perpendicular to a main surface of the substrate.

5. A semiconductor light emitting device, comprising:
a semiconductor light emitting element; and
a mounting substrate, wherein:
the semiconductor light emitting element includes:
   a substrate;
   an n-type layer located above the substrate and including an n-type semiconductor;
   a light emitting layer located above the n-type layer;
   a p-type layer located above the light emitting layer and including a p-type semiconductor;
   a p electrode located above the p-type layer;
   an n electrode located in a region that is above the n-type layer and in which the light emitting layer and the p-type layer are not located;
   a conductive p-electrode bump located above the p electrode and electrically connected to the p electrode;
   a conductive n-electrode bump located above the n electrode and electrically connected to the n electrode; and
   an insulation bump located in at least one region selected from a region between the n-electrode bump and the p-type layer and a region whose distance from an end of the p-type layer closer to the n-electrode bump is shorter than a distance from the end of the p-type layer to a position at which the p-electrode bump is located, in a plan view of the substrate,
the insulation bump includes a film and a columnar conductor, in order from a side on which the substrate is located,
the film is made of a resin containing a filler, and the columnar conductor is made of Au,
a surface of the insulation bump opposite to a surface facing the substrate is insulated from the p electrode and the n electrode, and the insulation bump is located above an end of the p-type layer facing the n electrode,
the mounting substrate includes a first wiring electrode electrically connected to the p-electrode bump and a second wiring electrode electrically connected to the n-electrode bump,
the insulation bump is located in a region sandwiched between the n electrode and the first wiring electrode, or in a region sandwiched between the p electrode and the second wiring electrode, and
in the plan view of the substrate, the insulation bump is located at an end of the p electrode facing the n electrode.

* * * * *